US007995380B2

(12) United States Patent
Liu

(10) Patent No.: US 7,995,380 B2
(45) Date of Patent: Aug. 9, 2011

(54) NEGATIVE DIFFERENTIAL RESISTANCE PULL UP ELEMENT FOR DRAM

(75) Inventor: Tsu-Jae King Liu, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 224 days.

(21) Appl. No.: 12/250,463

(22) Filed: Oct. 13, 2008

(65) Prior Publication Data
US 2009/0039438 A1    Feb. 12, 2009

Related U.S. Application Data

(60) Division of application No. 11/198,955, filed on Aug. 8, 2005, now Pat. No. 7,453,083, which is a continuation-in-part of application No. 10/828,356, filed on Apr. 19, 2004, now Pat. No. 6,956,262, which is a division of application No. 10/298,916, filed on Nov. 18, 2002, now Pat. No. 6,724,024, which is a continuation of application No. 10/028,085, filed on Dec. 21, 2001, now Pat. No. 6,559,470.

(51) Int. Cl.
*G11C 11/00* (2006.01)

(52) U.S. Cl. .............. 365/159; 365/189.11; 365/149; 365/204; 365/222; 257/369; 257/E27.002

(58) Field of Classification Search .............. 365/159, 365/189.11; 257/369, E27.002
See application file for complete search history.

(56) References Cited

U.S. PATENT DOCUMENTS

| 3,588,736 | A | 6/1971 | McGroddy |
| 3,651,426 | A | 3/1972 | Boatner et al. |
| 3,974,486 | A | 8/1976 | Curtis et al. |
| 4,047,974 | A | 9/1977 | Harari |
| 4,143,393 | A | 3/1979 | DiMaria et al. |
| 4,686,550 | A | 8/1987 | Capasso et al. |
| 4,806,998 | A | 2/1989 | Vinter et al. |
| 4,851,886 | A | 7/1989 | Lee et al. |
| 4,903,092 | A | 2/1990 | Luryi et al. |
| 4,945,393 | A | 7/1990 | Beltram et al. |

(Continued)

FOREIGN PATENT DOCUMENTS

EP    0747940 A2    12/1996
(Continued)

OTHER PUBLICATIONS

Final Report: SMILE MEL-ARI Project n°28741—Chapter V, pp. 184-194.
(Continued)

*Primary Examiner* — Tuan T Nguyen
*Assistant Examiner* — R Lance Reidlinger
(74) *Attorney, Agent, or Firm* — Bever, Hoffman & Harms, LLP; Jeanette S. Harms

(57) ABSTRACT

A memory cell includes a pull-up element that exhibits a refresh behavior that is dependent on the data value stored in the memory cell. The pull-up element is an NDR FET connected between a high voltage source and a storage node of the memory cell. The NDR FET receives a pulsed gate bias signal, wherein each pulse turns on the NDR FET when a logic HIGH value is stored at the storage node, and further wherein each pulse does not turn on the NDR FET when a logic LOW value is stored at the storage node. In this fashion a DRAM cell (and device) can be operated without a separate refresh cycle.

36 Claims, 7 Drawing Sheets

U.S. PATENT DOCUMENTS

| | | | |
|---|---|---|---|
| 5,021,841 | A | 6/1991 | Leburton et al. |
| 5,023,836 | A | 6/1991 | Mori |
| 5,032,877 | A | 7/1991 | Bate |
| 5,032,891 | A | 7/1991 | Takagi et al. |
| 5,055,891 | A | 10/1991 | Moll et al. |
| 5,084,743 | A | 1/1992 | Mishra et al. |
| 5,093,699 | A | 3/1992 | Welchold et al. |
| 5,130,763 | A | 7/1992 | Delhaye et al. |
| 5,162,880 | A | 11/1992 | Hazama et al. |
| 5,189,499 | A | 2/1993 | Izumi et al. |
| 5,250,815 | A | 10/1993 | Battersby et al. |
| 5,258,624 | A | 11/1993 | Battersby et al. |
| 5,302,838 | A | 4/1994 | Roenker et al. |
| 5,357,134 | A | 10/1994 | Shimoji |
| 5,390,145 | A | 2/1995 | Nakasha et al. |
| 5,442,194 | A | 8/1995 | Moise |
| 5,448,513 | A | 9/1995 | Hu et al. |
| 5,455,432 | A | 10/1995 | Hartsell et al. |
| 5,463,234 | A | 10/1995 | Toriumi et al. |
| 5,477,169 | A | 12/1995 | Shen et al. |
| 5,523,603 | A | 6/1996 | Fishbein et al. |
| 5,543,652 | A * | 8/1996 | Ikeda et al. .................... 257/377 |
| 5,606,177 | A | 2/1997 | Wallace et al. |
| 5,633,178 | A | 5/1997 | Kalnitsky |
| 5,675,157 | A | 10/1997 | Battersby |
| 5,689,458 | A | 11/1997 | Kuriyama |
| 5,698,997 | A | 12/1997 | Williamson, III et al. |
| 5,705,827 | A | 1/1998 | Baba et al. |
| 5,732,014 | A | 3/1998 | Forbes |
| 5,742,092 | A | 4/1998 | Zotov et al. |
| 5,761,114 | A | 6/1998 | Bertin et al. |
| 5,770,958 | A | 6/1998 | Arai et al. |
| 5,773,996 | A | 6/1998 | Takao |
| 5,798,965 | A | 8/1998 | Jun |
| 5,804,475 | A | 9/1998 | Meyer et al. |
| 5,843,812 | A | 12/1998 | Hwang |
| 5,869,845 | A | 2/1999 | Van der Wagt et al. |
| 5,883,549 | A | 3/1999 | De Los Santos |
| 5,883,829 | A | 3/1999 | Van der Wagt |
| 5,895,934 | A | 4/1999 | Harvey et al. |
| 5,903,170 | A | 5/1999 | Kulkarni et al. |
| 5,907,159 | A | 5/1999 | Roh et al. |
| 5,936,265 | A | 8/1999 | Koga |
| 5,945,706 | A | 8/1999 | Jun |
| 5,953,249 | A * | 9/1999 | van der Wagt ................. 365/175 |
| 5,959,328 | A | 9/1999 | Krautschneider et al. |
| 5,962,864 | A | 10/1999 | Leadbeater et al. |
| 6,015,739 | A | 1/2000 | Gardner et al. |
| 6,015,978 | A | 1/2000 | Yuki et al. |
| 6,016,281 | A * | 1/2000 | Brox ......................... 365/230.06 |
| 6,075,265 | A | 6/2000 | Goebel et al. |
| 6,077,760 | A | 6/2000 | Fang et al. |
| 6,084,796 | A | 7/2000 | Kozicki et al. |
| 6,091,077 | A | 7/2000 | Morita et al. |
| 6,097,036 | A | 8/2000 | Teshima et al. |
| 6,104,631 | A | 8/2000 | El-Sharawy et al. |
| 6,128,216 | A | 10/2000 | Noble, Jr. et al. |
| 6,130,559 | A | 10/2000 | Balsara et al. |
| 6,150,242 | A | 11/2000 | Van der Wagt et al. |
| 6,184,539 | B1 | 2/2001 | Wu et al. |
| 6,194,303 | B1 | 2/2001 | Alphenaar et al. |
| 6,205,054 | B1 | 3/2001 | Inami |
| 6,222,766 | B1 | 4/2001 | Sasaki et al. |
| 6,225,165 | B1 | 5/2001 | Noble, Jr. et al. |
| 6,229,161 | B1 * | 5/2001 | Nemati et al. ................. 257/133 |
| 6,246,606 | B1 | 6/2001 | Forbes et al. |
| 6,261,896 | B1 | 7/2001 | Jun |
| 6,294,412 | B1 | 9/2001 | Krivokapic |
| 6,301,147 | B1 | 10/2001 | El-Sharawy et al. |
| 6,303,942 | B1 | 10/2001 | Farmer |
| 6,310,799 | B2 | 10/2001 | Duane et al. |
| 6,396,731 | B1 | 5/2002 | Chou |
| 6,404,018 | B1 | 6/2002 | Wu et al. |
| 6,559,470 | B2 | 5/2003 | Tsu-Jae |
| 2001/0005327 | A1 | 6/2001 | Duane et al. |
| 2001/0013621 | A1 | 8/2001 | Nakazato |
| 2001/0019137 | A1 | 9/2001 | Koga et al. |
| 2001/0024841 | A1 | 9/2001 | Noble, Jr. et al. |
| 2001/0053568 | A1 | 12/2001 | Deboy et al. |
| 2002/0066933 | A1 | 6/2002 | Tsu-Jae |
| 2002/0093030 | A1 | 7/2002 | Hsu et al. |
| 2002/0100918 | A1 | 8/2002 | Hsu et al. |
| 2002/0109150 | A1 | 8/2002 | Kajiyama |

FOREIGN PATENT DOCUMENTS

| | | |
|---|---|---|
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| WO | WO 90/03646 | 4/1990 |
| WO | WO 99/63598 | 4/1999 |
| WO | WO 00/41309 | 7/2000 |
| WO | WO 01/65597 A1 | 9/2001 |
| WO | WO 01/69607 A2 | 9/2001 |
| WO | WO 01/99153 A2 | 12/2001 |

OTHER PUBLICATIONS

News Release from www.eurekalert.org/releases/udel-udcnfib.html, "UD Computer News: Future Looks Bright for Tunnel Diodes, Promising Faster, More Efficient Circuits," Oct. 1,1998, 4 pages.

P. S. Barlow, et al., "Negative differential output conductance of self-heated power MOSFETs," IEE Proceedings-I Solid-State and Electron Devices, vol. 133, Part I, No. 5, Oct. 1986, pp. 177-179.

E. Chan, et al., "Compact Multiple-Valued Multiplexers Using Negative Differential Resistance Devices," IEEE Journal of Solid-State Circuits, vol. 31, No. 8, Aug. 1996, pp. 1151-1156.

E. Chan, et al., "Mask Programmable Multi-Valued Logic Gate Arrays Using RTDs and HBTs," IEE Proceedings-E: Computers and Digital Techniques, vol. 143, No. 5, Oct. 1996, pp. 289-294.

Deen, Jamal (editor) et al., excerpt from "CMOS RF modeling, characterization and applications," World Scientific, Apr. 2002, 34 pages.

Dozsa, L. et al., "A transient method for measuring current-voltage characteristics with negative differential resistance regions," Research Institute for Technical Physics, P.O. Box 76, H-1325 Budapest, Hungary, (Received Jul. 24, 1997; accepted Aug. 1, 1997), 2 pages.

Gardner, Carl, Ringhofer, Christian, "Smooth Quantum Hydrodynamic Model Simulation of the Resonant Tunneling Diode," Dept. Of Mathematics Arizona State University, pp. 1.5, (1998).

Geppert, Linda, "Quantum transistors: toward nanoelectronics," IEEE Spectrum, Sep. 2000, pp. 46-51.

Goldhaber-Gordon, David at al., "Overview of nanoelectronic devices," Proc. IEEE, 85(4), Apr. 1997, pp. 521-540.

Alejandro F. Gonzalez, et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

Haddab, Y. et al., "Quantized current jumps in silicon photoconductors at room temperature," J. Appl. Phys. 86 (7),1 Oct. 1999, pp. 3787-3791.

G. I. Haddad et al., "Tunneling Devices and Applications in High Functionality/Speed Digital Circuits," Solid State Electronics, vol. 41, No. 10, Oct. 1997, pp. 1515-1524.

Hansch, W. et al., "The planar-doped-barrier-FET: MOSFET overcomes conventional limitations," ESSDERC'97 27th European Solid-State Device Research Conference, Stuttgart, Sep. 22-24, 1997, 4 pages.

C. P. Heij, et al., "Negative Differential Resistance Due to Single-Electron Switching," Applied Physics Letters, vol. 74, No. 7, Feb. 15, 1999, 5 pages.

Hong, J.W. et al, "Local charge trapping and detection of trapped charge by scanning capacitance microscope in SIO2/Si system," Appl. Phys. Lett., 75 (12), Sep. 20, 1999, pp. 1760-1762.

Jungel, A, Pohl, C., "Numerical Simulation of Semiconductor Devices: Energy-Transport and Quantum Hydrodynamic Modeling," Fachbereich Math., Tech. Univ. Berlin, Germany, pp. 1-9, 1998.

Karna, Shashi P. et al., "Point defects in SI-SI02 systems: current understanding," Published in G. Pacchioni et al. (eds.), "Defects in SI02 and related dielectrics: science and technology," Kluwer Academic Publishers, p. 599-615, (2000),19 pages.

King, Tsu-Jae et al., U.S. Appl. No. 09/602,668, entitled "CMOS Compatible Process for Making a Tunable Negative Differential Resistance (NDR) Device," filed Jun. 22, 2000, 33 pages.

King, Tsu-Jae et al., U.S. Appl. No. 09/603,101, entitled "CMOS-Process Compatible, Tunable NDR (Negative Differential Resistance) Device and Method of Operating Same," filed Jun. 22, 2000, 34 pages.

King, Tsu-Jae et al., U.S. Appl. No. 09/603,102, entitled "Charge Trapping Device and Method for Implementing a Transistor having a Negative Differential Resistance Mode," filed Jun. 22, 2000, 39 pages.

S. J. Koester, et al., "Negative Differential Conductance In Lateral Double-Barrier Transistors Fabricated in Strained Si Quantum Wells," Applied Physics Letters, vol. 70, No. 18, May, 1997, pp. 2422-2424.

O. Le Neel, et al., "Electrical Transient Study of Negative Resistance in SOI MOS Transistors," Electronics Letters, vol. 26, No. 1, pp. 73-74, Jan. 1990.

S. Luryi and M. Mastrapasqua, "Light-emitting Logic Devices based on Real Space Transfer in Complementary InGaAs/InAIAs Heterostructures", In "Negative Differential Resistance and Instabilities in 2D Semiconductors", ed. by N. Balkan, B. K. Ridley, and A. J. Vickers, NATO ASI Series [Physics] B 307, pp. 53-82, Plenum Press (New York 1993).

Serge Luryi and Mark Pinto, "Collector-Controlled States and the Formation of Hot Electron Domains in Real-Space Transfer Transistors," AT&T Bell Laboratories, pp. 1-7, 1992.

Serge Luryi and Mark Pinto, "Collector-Controlled States in Charge Injection Transistors," SPIE-92 Symposium, pp. 1-12, 1992.

R. H. Mathews, et al., "A New RTD-FET Logic Family," Proceedings of the IEEE, vol. 87, No. 4, pp. 596-605, 1999.

P. Mazumder, et al., "Digital Circuit Applications of Resonant Tunneling Devices," Proceedings of the IEEE, vol. 86, No. 4, pp. 664-686, Apr. 1998.

S. Mohan, et al., "Logic Design Based on Negative Differential Resistance Characteristics of Quantum Electronic Devices," IEE Proceedings-G: Electronic Devices, vol. 140, No. 6, Dec. 1993, pp. 383-391.

S. Mohan, et al., "Ultrafast Pipelined Adders Using Resonant Tunneling Transistors," IEE Electronics Letters, vol. 27, No. 10, May 1991, pp. 830-831.

S. Mohan, et al., "Ultrafast Pipelined Arithmetic Using Quantum Electronic Devices," IEE Proceedings-E: Computers and Digital Techniques, vol. 141, No. 2, Mar. 1994, pp. 104-110.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor-based SRAM Cell (T-RAM) for High-Speed, Low-Voltage, Giga-scale Memories," Center for Integrated Systems, Stanford University, CA, (4 pages).

S.M.A. Nimour, R. Ouasti, N. Zekri, "Effect of Spatially Disordered Barriers on the Band Structure of Finite Superlattices," phys. stat. sol. (b) 1998, 209, No. 2, 311-318.

R. Oberhuber, et al., "Tunnel-Devices with Negative Differential Resistivity Based on Silicon?," Source: Deutsche Forschungsgemeinschaft and Siemens AG, date unknown, 2 pages.

C. Pacha, et al., "Resonant Tunneling Device Logic Circuits," Microelectronics Advanced Research Initiative (MEL-ARI,) Jul. 1998-Jul. 1999, pp. 1-22.

C. Pacha and K. Goser, "Design of Arithmetic Circuits using Resonant Tunneling Diodes and Threshold Logic," Lehrstuhi Bauelemente der Elektrotechnik, Universitat Dortmund, pp. 1-11, Sep. 1997.

S. L. Rommel, et al., "Room Temperature Operation of Epitaxially Grown SI/SI0.5Ge0.5/Si Resonant Interband Tunneling Diodes," Applied Physics Letters, vol. 73, No. 15, pp. 2191-2193, 1998.

Scoffield, John H. et al., "Reconciliation of different gate-voltage dependencies of 1/f noise in n-MOS and p-MOS transistors," IEEE Trans. Electron. Dev. 41 (11),11 pgs.

A. Seabaugh, "Promise of Tunnel Diode Integrated Circuits," Tunnel Diode and CMOS/HBT Integration Workshop, Dec. 9, 1999, Naval Research Laboratory, Washington, DC., 13 Pages.

Seabaugh A., Brar B., Broekaert T., Morris F., and Frazier G., "Resonant Tunneling Mixed Signal Circuit Technology," Solid-State Electronics 43:1355-1365, 1999.

Seabaugh, A. et al., "Tunnel-Diode IC," Minneapolis, Oct. 2, 2001, 23 pages.

Shao, Z., Porod, W., Lent, C., & Kirkner, D., "Transmission Zero Engineering in Lateral Double-Barrier Resonant Tunneling Devices," Dept. Of Electrical Engineering, University of Notre Dame, pp. 1-7 (1996).

Shoucair F. et al., "Analysis and Simulation of Simple Transistor Structures Exhibiting Negative Differential Resistance," EECS Department, UC Berkeley, Berkeley CA, (4 pages).

J. P. Sun, et al., "Resonant Tunneling Diodes: Models and Properties," Proceedings of the IEEE, vol. 88, No. 4, Apr. 1998, pp. 841-681.

J. P. A. Van Der Wagt, "Tunneling-Based SRAM," Proceedings of the IEEE, vol. 87, No. 4, pp. 571-595, 1999.

J. P. A. Van Der Wagt, et al., "RTD/HFET Low Standby Power SRAM Gain Cell," Source: Corporate Research Laboratories, Texas Instruments, 1998, 4 pages.

Villa, S. et al., "Application of 1/f noise measurements to the characterization of near-interface oxide states in ULSI n-MOSFET's," Dipartimento di Eiettronica e nformazione, Politecnlco di Milano (Italy), 7 pages.

Wirth, G. et al., "Periodic transconductance oscillations in sub-100nm MOSFETs," ESSDERC'97 27th European Solid-State Device Research Conference, Stuttgart, Sep. 22-24, 1997, 4 pages.

G. Wirth, et al., "Negative Differential Resistance in Ultrashort Bulk MOSFETs," IECON'99 Conference Proceedings, vol. 1, San Jose, 1999, S. 29-34.

Jian Fu Zhang, "Traps: Detrapping," Wiley Encyclopedia of Electrical and Electronics Engineering Online, Article Posting Date: Dec. 27, 1999, John Wiley & Sons, Inc., 4 pages.

Jian Fu Zhang, "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Jian Fu Zhang, "Traps: Measurement Techniques," Wiley Encyclopedia of Electrical and Electronics Engineering Online, Article Posting Date: Dec. 27, 1999, John Wiley & Sons, Inc., 5 Pages.

Jian Fu Zhang, "Traps: Origin of Traps," Wiley Encyclopedia of Electrical and Electronics Engineering Online, Article Posting Date: Dec. 27, 1999, John Wiley & Sons, Inc., 4 pages.

Jian Fu Zhang, "Traps: Trapping Kinetics," Wiley Encyclopedia of Electrical and Electronics Engineering Online, Article Posting Date: Dec. 27, 1999, John Wiley & Sons, Inc., 2 Pages.

Jian Fu Zhang, "Traps," Wiley Encyclopedia of Electrical and Electronics Engineering Online, Article Posting Date: Dec. 27, 1999, John Wiley & Sons, Inc., 2 Pages.

Zhang, J.F. et al., "A comparative study of the electron trapping and thermal detrapping in SiO2 prepared by plasma and thermal oxidation," J. Appl. Phys. 72 (4), Aug. 15, 1992, pp. 1429-1435.

Zhang, J.F. et al., "A quantitative Investigation of electron detrapping in SiO2 under Fowler-Nordheim stress," J. Appl. Phys. 71 (12), Jun. 15, 1992, pp. 5989-5996.

Zhang, J.F. et al., "Electron trap generation in thermally grown SIO2 under Fowler-Nordheim stress," J. Appl. Phys. 71 (2), Jan. 15, 1992, pp. 725-734.

* cited by examiner

Fig. 4

| Standard CMOS Starting Material |
|---|
| Standard CMOS Isolation Process |
| NDR Surface Doping Process Sequence |
| NDR Device Gate Insulator Formation |
| N-well Dopant Process Sequence (for PMOS) |
| P-well Dopant Process Sequence (For NMOS) |
| Logic Device Gate Oxidation |
| Gate Material Deposition and Patterning |
| NDR Drain Junction Engineering Sequence |
| Source/Drain Pattern and Process Sequence |
| Oxide Deposition |
| Contact Process Sequence |
| Metal Process Sequence |

NEGATIVE DIFFERENTIAL RESISTANCE PULL UP ELEMENT FOR DRAM

CROSS REFERENCE TO RELATED APPLICATIONS

The present application is a divisional of Ser. No. 11/198,955 entitled NEGATIVE DIFFERENTIAL RESISTANCE FIELD EFFECT TRANSISTOR FOR IMPLEMENTING A PULL UP ELEMENT IN A MEMORY CELL filed Aug. 8, 2005 which is a continuation-in-part of Ser. No. 10/828,356 entitled CHARGE TRAPPING PULL-UP ELEMENT filed Apr. 19, 2004 which is a divisional of Ser. No. 10/298,916 entitled FIELD EFFECT TRANSISTOR PULL-UP/LOAD ELEMENT filed Nov. 18, 2002 (U.S. Pat. No. 6,724,024) which is a continuation of Ser. No. 10/028,085 entitled NEGATIVE DIFFERENTIAL RESISTANCE FIELD EFFECT TRANSISTOR (NDR-FET) AND CIRCUITS USING THE SAME filed Dec. 21, 2001 (U.S. Pat. No. 6,559,470).

FIELD OF THE INVENTION

This invention relates to semiconductor devices and more particularly to a dynamic random access memory cell that uses a negative differential resistance (NDR) pull-up element.

BACKGROUND OF THE INVENTION

A new type of CMOS compatible, NDR capable FET is described in the aforementioned application King referenced above. The advantages of such device are well set out in such materials, and are not repeated here.

In preferred embodiments, this device typically uses a dielectric layer for creating a charge trapping region that rapidly traps/detraps charge carriers. A number of different techniques are explained for forming said traps to achieve a desired NDR effect. It is apparent, nonetheless, that additional processing techniques (and/or more optimized versions of the processes described in King) would be beneficial for expanding the availability of such devices.

A current trend also is to use so called silicon-on-insulator substrates to manufacture integrated circuits. It is expected that this technology will experience rapid growth in the years to come, but to date, only two terminal NDR diodes have been implemented in such environments. Thus, there is clearly a need for an NDR device that is as easy to integrate as a conventional FET in such technology.

Another growing trend is the use of NDR devices as load elements in SRAM memory cells and other circuit applications. To date, such NDR devices have been limited to two terminal, diode type structures which have operational limitations as well as integration complexities with CMOS processing. Furthermore, it is not possible, for example, to implement a low power memory cell using a single channel technology; current approaches are limited to conventional CMOS, where both p and n type transistors are required. Accordingly, there is an apparent compelling need for a low cost, easily integrable NDR solution for such applications as well.

SUMMARY OF THE INVENTION

Accordingly, an object of the present invention is to overcome the aforementioned deficiencies in the prior art.

Another object of the present invention is to provide an NDR FET that includes additional variations and improvements over the NDR FET described in King.

Still a further object of the present invention is to provide an additional type of trapping layer, and/or new types of charge traps that can be used advantageously in an NDR FET.

Another object of the present invention is to provide an NDR FET that is embodied within an SOI substrate.

Still a further object of the present invention is to provide a new type of general low power, single channel technology for effectuating logic and memory circuits.

Yet another object of the present invention is to provide an improved type of NDR device that is more flexible and more easily integrated (than prior NDR diode devices) into conventional semiconductor circuits, including SRAM memory cells.

Another object of the present invention is to provide an NDR element that can serve as a useful pull-up device in a memory cell.

Another object of the present invention is to provide an improved data refreshing technique for DRAM memory cells.

These and other objects are provided by a first aspect of the present invention, which includes a semiconductor structure comprising a semiconductor substrate, and a dielectric layer (gate insulation layer) located on the semiconductor substrate, such that an interface region is formed between the semiconductor substrate and the dielectric layer. A plurality of carrier trapping sites within the interface region are configured for trapping carriers that are electrically biased by an electrical control field to move from a channel into the interface region. Thus, a current in the channel varies from a first current value associated with a conducting condition, to a second current value associated with a non-conducting condition, where the second current value is substantially less than the first current value.

In a preferred embodiment, a trap energy level for the trapping sites in the interface region is higher than a conduction band edge of the channel. Furthermore, the trap energy level is set so that said trapping sites trap primarily hot carriers (and not normal carriers) flowing in the channel to avoid interfering with the operation of the FET. To achieve this result, a trap energy level is set to approximately 0.5 eV higher than the conduction band edge. The semiconductor structure is incorporated as part of an insulated gate field effect transistor which otherwise behaves like a conventional FET in a first region of operation, but yet has NDR capability in a second region of operation.

In the preferred embodiment, the hot carriers tunnel from the channel to the trapping sites, but they are not energized to tunnel from the channel to a conduction band of the interface region. Nor is the interface region required to have a matching conduction band to facilitate a tunneling process, as required in conventional NDR devices.

Further in a preferred embodiment, an NDR FET shares one or more common structures with a conventional insulated gate field effect transistor (IGFET), so that a common set of processing operations can be used to manufacture both types of elements for an integrated circuit.

In other variations, the trapping sites can include water based traps created by a steam ambient. The NDR FET uses an n-type channel implanted with a p-type dopant so that a relatively large electric bias field can be set up to facilitate moving said carriers from said channel to said trapping sites.

In another aspect of the invention, a memory cell includes at least one first dopant type channel insulated gate field effect transistor (IGFET). The first-channel type IGFET has an IGFET gate terminal, an IGFET source terminal connected to a first potential, and an IGFET drain terminal coupled to a storage node. In lieu of a conventional two terminal diode, the present invention incorporates a negative differential resistance field-effect transistor (NDR-FET) element that also has a first dopant-type channel, and acts as a pull-up or pull-down device when connected in series with the IGFET. The NDR FET element includes a first NDR FET drain terminal connected to a second potential, a second NDR source terminal connected to the storage node, and a third NDR gate terminal connected to a bias voltage. In this fashion the memory cell is formed entirely of active devices having a common channel dopant type.

In a preferred embodiment, the NDR FET element and the IGFET share at least a common substrate and a common gate insulation layer. In addition, the gate terminals for both devices can be fabricated from a single conductive layer. The two devices can further share one or more terminals (i.e., source/drain regions).

In this fashion, an NDR memory cell can be constructed that is integrated into a conventional fabrication process much easier than conventional NDR diodes. Furthermore, the cell can be made so that both devices use single channel type of dopant (i.e., both are n-channel or p-channel), and yet still achieve low power operation as with CMOS implementations.

In another embodiment, a memory cell can include a pull-up element (e.g., NDR FET) and a storage capacitor connected in series between a high supply voltage (e.g., $V_{DD}$) and a low supply voltage (e.g., ground ($V_{SS}$)). An access transistor coupled between a bit line and a storage node at the junction of the NDR FET and the storage capacitor can be provided for read/write access to the memory cell. By providing a pulsed gate bias signal to the gate of the NDR FET, the complex refresh circuitry required by conventional DRAM memory cells can be eliminated. When a logic HIGH value is stored at the storage node, each pulse of the pulsed gate bias signal turns on the NDR FET to recharge the storage capacitor in response to any charge leakage at the storage capacitor. However, when a logic LOW value is stored at the storage node, the NDR FET operates in NDR mode, so that the pulses of the pulsed gate bias signal do not turn on the NDR FET. Therefore, the NDR FET behavior is based on the data stored on the storage capacitor, so that the NDR FET is able to "ignore" stored logic LOW values and only refresh stored logic HIGH values.

In one embodiment, a memory array (e.g., a DRAM) can include multiple memory cells, with each memory cell including a pull-up element and a storage capacitor connected in series between a high supply voltage (e.g., $V_{DD}$) and a low supply voltage (e.g., ground ($V_{SS}$)). An access transistor in each memory cell can be coupled between a bit line and a storage node at the junction of the NDR FET and the storage capacitor to provide read/write access to the memory cell. The memory array can include gate bias logic (circuitry) for providing pulsed gate bias signals to the gates of the NDR FETs in the memory cells in lieu of the complex refresh circuitry required by conventional DRAM memory cells. When a logic HIGH value is stored at a given storage node, each pulse of the pulsed gate bias signal provided to that memory cell turns on the NDR FET to recharge the storage capacitor in response to any charge leakage at the storage capacitor. However, when a logic LOW value is stored at the storage node, the NDR FET operates in NDR mode, so that the pulses of the pulsed gate bias signal do not turn on the NDR FET. The gate bias logic can include any type of circuitry for providing pulsed gate bias signals, such as a shift register for providing pulses to each row or column of memory cells in a sequential loop (i.e., providing the a pulse to each row/column in series and then looping back to the first row/column).

The invention will be more fully understood in light of the Figures and the following detailed description.

BRIEF DESCRIPTION OF THE DRAWINGS

FIG. 4 is an illustrative process sequence for integrating the NDR-MISFET into a conventional CMOS logic process flow;

DETAILED DESCRIPTION OF PREFERRED EMBODIMENTS

Figure 1:
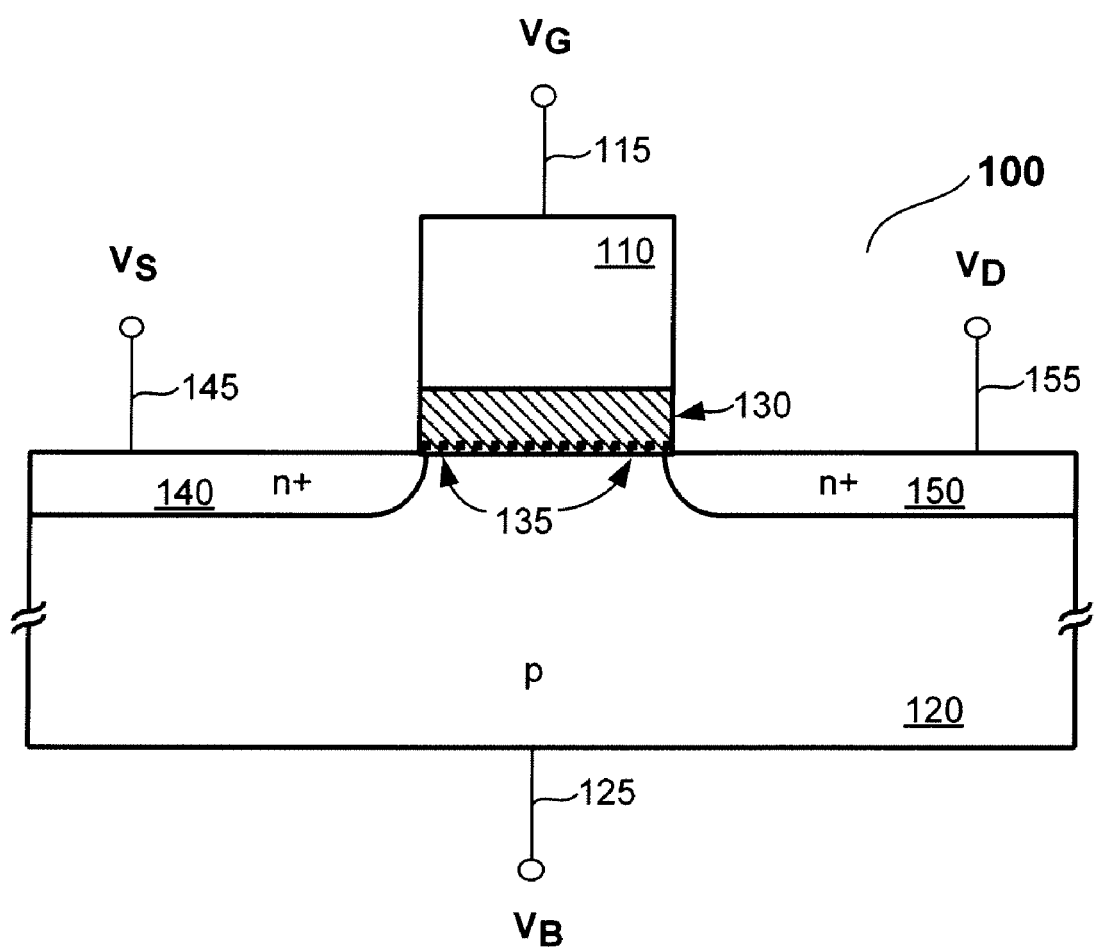
FIG. 1 is the schematic cross-sectional view of an embodiment of the NDR metal-insulator-semiconductor field-effect transistor (MISFET) disclosed in this invention, including a body contact terminal 125 for receiving an NDR mode enable/disable bias signal.

The following detailed description is meant to be illustrative only of particular embodiments of the invention. Other embodiments of the invention and variations of those disclosed will be obvious to those skilled in the art in view of the following description.

As discussed below, a preferred device embodiment is described first. Next, the mechanism responsible for the negative differential resistance (NDR) mode is described, followed by additional preferred embodiments for enhancing the performance of an NDR device. Finally, an exemplary method of fabrication will be described.

In accordance with a preferred embodiment of the invention, an n-channel field effect transistor (FET) NDR device structure (FIG. 1) 100 is provided which is made with minimum modification to a standard CMOS process. In fact, from a first glance, device 100 appears to be an ordinary n-channel MOS (NMOS) transistor, in which a gate electrode 110 of the device is formed on top of a semiconductor substrate 120 and electrically insulated from the substrate by a dielectric layer 130. Right away it can be seen that NDR device 100 in this invention is distinctly different from NDR devices in the prior art.

Prior-art NDR devices are typically two-terminal diode devices, made with very complicated and expensive process sequences which are incompatible with a conventional CMOS process. Although NDR device 100 in this invention is similar in appearance to an NMOS transistor, it incorporates slight but critical modifications, as taught in this invention, in order for the device to manifest the desired NDR output characteristic mode.

A first modification is that a p-type dopant concentration in a surface region of the semiconductor substrate underneath the gate electrode (the channel) is relatively high compared to a contemporary conventionally processed n-channel device. In a preferred embodiment of device 100, the p-type dopant concentration is greater than $1 \times 10^{18}$ cm$^{-3}$ in the channel. Of course, it will be understood that for any particular design rule, device characteristic and process environment the p-type dopant concentration may be varied accordingly, and that some routine design, simulation and/or testing may be necessary to optimize the performance of the device in any particular application. Accordingly, the present invention is not limited to any particular concentration, but, instead, is guided more by considerations of whether a sufficient dopant concentration has been introduced to help contribute to the NDR effect. More heavily doped n-type regions in the semiconductor surface region, adjacent to the channel and located at each end of the gate electrode, form the source and drain contact regions 140 and 150 respectively. The electric potential of the channel can be further adjusted via a body contact terminal 125.

A second modification of present device 100 over a conventional transistor is the fact that charge traps or storage nodes 135 exist in insulating layer 130 between semiconductor substrate 120 and gate electrode 110. These charge traps are located relatively close to (ideally within 0.5 nm of) semiconductor-insulator interface 138, so that charges from semiconductor 120 can be trapped and de-trapped very quickly. Again it will be understood that this distance figure is based on the details of the present embodiment, and that for any particular environment this parameter may vary significantly, so the present invention is not limited by the particular details of the same. The key point, of course, is the existence of these charge traps, or some other physical feature that acts to store electrons. It will be understood of course that the drawing of FIG. 1 is merely an illustration to better describe the features of the present invention, and thus the arrangement and location of the trapping sites 135 is not drawn to scale.

A third modification is that insulating layer 130 between semiconductor substrate 120 and gate electrode 110 is relatively thick (ideally greater than 2 nm) to prevent significant loss of trapped charge to the gate electrode via tunneling. Those skilled in the art will again appreciate that this thickness is again a function of the particular material, processing environment, etc., and that the present invention is by no means limited to such figure.

Figure 2:
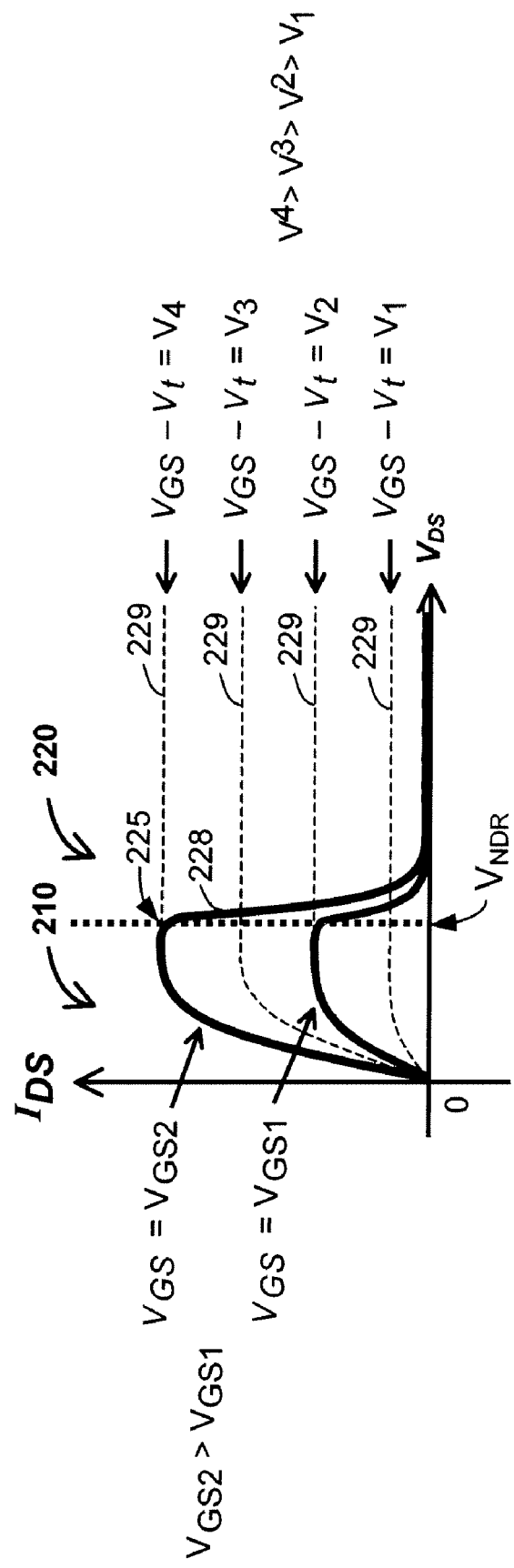
FIG. 2 is a graphical chart illustrating the current versus voltage (I-V) characteristics of the NDR-MISFET, including an NDR operating region.

With source and body terminals 145 and 125 of device 100 held at ground potential and gate terminal 115 biased sufficiently high to turn on the device, the output characteristic (drain current as a function of drain voltage) of device 100 will exhibit negative differential resistance over a range of drain voltages. This aspect of the invention is illustrated in FIG. 2, where device drain current versus drain voltage is plotted for two different gate voltages ($V_{GS1}$ and $V_{GS2}$) to show how the NDR mode can be affected by a suitable selection of the gate bias voltage (i.e., the gate-to-source voltage $V_{GS}$). It can be seen that for a fixed gate bias voltage $V_{GS}$, drain current $I_{DS}$ increases in a standard operating region 210 (i.e., drain-to-source voltage $V_{DS}$ less than an NDR threshold voltage $V_{NDR}$) with drain voltage $V_{DS}$, in a manner similar to the behavior that is seen in drain current for a conventional NMOS transistor. Surprisingly, however, in an NDR operating region 220 (i.e., drain-to-source voltage $V_{DS}$ greater than an NDR threshold voltage $V_{NDR}$), drain current IDS decreases with further increases in drain-to-source voltage $V_{DS}$, i.e. the device exhibits an NDR mode with NDR characteristics. The drain-to-source voltage at which the drain current begins to decrease (i.e., point 225 where $V_{DS}=V_{NDR}$) is adjustable through suitable selections of channel length, channel doping, etc. It should be noted that, due to the relatively high channel dopant concentration and the relatively thick gate dielectric, the standard threshold voltage of the NDR FET (i.e., the gate-to-source voltage at which an inversion-layer forms in the channel while the NDR FET is operating in standard operating region 210) can be significantly higher than that of a conventional MOSFET, so that a larger than typical gate voltage may be used for the NDR FET. As the gate-to-source bias voltage $V_{GS}$ increases, the vertical electric field attracting electrons towards the gate electrode increases, thereby enhancing the NDR effect.

This behavior by device 100 of the present invention is rather surprising, and is apparently the result of physical mechanisms that have hitherto not been exploited in this area of semiconductor devices and processing. In the prior art, band-to-band quantum-mechanical tunneling of charged particles (electrons and/or holes) from one side of a diode to the other side is known to be the primary mechanism for NDR in tunneling diodes. In contrast, for device 100 of the present invention, the physical mechanism appears to be rapid trapping of electrons in the gate insulator underneath the gate electrode, near to (within 0.5 nm of) the semiconductor-insulator interface. Referring to the device structure in FIG. 1, when device 100 is biased with a sufficiently high gate voltage such that the channel of the device is in the strong-inversion condition (i.e. when the gate-to-source voltage is greater than the standard threshold voltage), a current flows between the source and drain terminals 145 and 155 respectively of the device if a small voltage is applied between such terminals. Since the channel is configured to contain a relatively high p-type dopant concentration, a vertical (in the direction perpendicular to the semiconductor surface) electric field in the channel is large (greater than $10^6$ V/cm). As the drain-to-source voltage increases, the lateral (in the direction parallel to the semiconductor surface) electric field increases, so that a composite (horizontal+vertical) electric field exerting force on inversion-layer electrons in the channel increases. Once this composite electric field reaches a certain critical value (which of course will be a function of the doping and geometry of the device) electrons flowing from source 140 to drain 150 will gain sufficient energy between collisions to surmount a semiconductor-insulator interface potential barrier. Since the vertical electric field component attracts the electrons toward gate electrode 110, electrons enter insulator 130 and subsequently are captured by the traps or storage nodes 135 in the insulator. The presence and accumulation of negative charge in insulator 130 dynamically increases the threshold voltage of device 100 above the standard threshold voltage, thereby changing the mode of operation from the standard operating region (210) to the NDR operating region (220). In other words, the electrons accumulated in the traps/storage nodes 135 operate to set up a counter field that inhibits the movement of additional electrons into the channel from the source, and reducing an available channel current by reducing a density of electrons in the channel region. Thus, the net effect created by the traps/storage nodes 135 of the present invention is a drastic reduction in the inversion-layer charge density and commensurate reduction in the current flowing between the source and the drain. It can be seen plainly that the amount of net current in the channel that can be affected by the traps is a function of their number, concentration, location, and the bias conditions imposed on device 100, all of which are easily controllable and optimizable for any particular environment, so that the onset conditions, strength and operating region for a negative differential resistance mode can be tailored and customized as needed.

It is noted that the present disclosure teaches that only a single species of energetic carriers (hot electrons) are generated in a channel region and trapped in insulator 130, and both of these phenomena preferably occur in a substantially uniform manner throughout the channel length. This operation, too, is distinctly different from the case for a conventional NMOS transistor, in which hot electrons are generally generated in the depletion region of the drain p-n junction, leading to impact ionization and an avalanche effect resulting in significant numbers of hot holes as well as hot electrons. Typically, this effect is maximized at a gate-to-source voltage which is lower than the drain-to-source voltage (for example, at a gate voltage equal to one half the drain voltage); hence in a conventional device the vertical electric field in the channel near the drain junction attracts hot holes, rather than hot electrons, toward the gate electrode. Clearly, then, this explains why the creation of hot electrons in a conventional NMOS transistor (even if it occurs incidentally) cannot produce the negative differential resistance characteristic as described in this invention. Furthermore it is well known that the injection of hot holes into the gate insulator causes damage, adversely affecting the performance and reliability of the NMOS transistor. In the NDR FET 100 of the present invention, although holes are generated by impact ionization in the channel, they are not injected (or their injection is substantially eliminated to the point where it is negligible from an operational perspective) into gate insulator 130 because the vertical electric field repels holes from gate electrode 110.

As a point of further clarification, the mechanism responsible for the NDR characteristic of the present invention also does not require that NDR FET 100 be operating in a conventional "pinch-off" condition, i.e., in which a gate-to-drain voltage is lower than a threshold voltage so that the inversion-layer charge density in the channel adjacent to the drain is zero. In the pinch-off condition, the lateral electric field is non-uniformly distributed in the channel between the source and drain: the electric field increases gradually and linearly with distance away from the source, and then increases exponentially in the depletion region of the drain junction, so that the generation of hot electrons occurs predominantly in the depletion region of the drain junction, resulting in drain avalanche. In contrast, in the present invention, NDR FET 100 is preferably operated in a "triode" region, so that the electric field increases uniformly from the source end of the channel to the drain end. The drain current saturates due to velocity saturation, not pinch-off, so the current does not increase linearly with $V_{DS}$ (as seen generally in FIG. 2).

In a preferred embodiment of NDR FET 100, sufficient bias is applied so that the electrons in the channel become so energetic that channel hot electrons are created due to the high composite electric field in the channel. These channel hot electrons have sufficient energy imparted from the horizontal component of this field to surmount the potential barrier at the semiconductor-insulator interface and enter gate insulator 130 because the vertical electric field component attracts them toward gate electrode 110. The electrons are captured by the traps or storage nodes 135 in insulator 130; consequently the threshold voltage of the transistor increases dynamically (above the standard threshold voltage). More charge is trapped as the drain-to-source voltage increases (for a constant gate voltage), because the generation of hot carriers (and thus the percentage of the current that is based on a hot carrier component) correspondingly increases, and it is these hot carriers that are trapped. As greater numbers of hot carriers are trapped, they increase the threshold voltage and thereby reduce the mobile charge density in the channel by a disproportionate amount (compared to the hot-carrier current charge amount), thus decreasing the drain current dramatically. This results in the negative differential resistance in the output (drain current versus drain voltage) characteristic. It can be seen also that more charge can be trapped by increasing the vertical component of the field as well, since this increases the likelihood that a charged carrier will be forced into a trap 135 in dielectric layer 130 (the trapping rate), and also increases a temporary storage/trapping time associated with the charge. It is not necessary, nonetheless, to trap a significant number of carriers, because even a small quantity stored in the trapping sites can be sufficient to deplete the channel of mobile carriers. It is also preferable to not increase the vertical field to the point where some deleterious side effects (dielectric breakdown or lack of fast reversibility of the NDR effect for example) are seen. In other words, it is generally desirable to have the charges rapidly trapped and de-trapped at a particular rate that ensures that the device can be put into and out of an NDR mode or operating region quickly, instead of being confined to working within a particular region. Other techniques for increasing the amount of trapped charges, and the trapping/detrapping rates will be apparent to those skilled in the art. For instance, it may not be necessary in fact in some applications, to make the electrons "hot" because they will still be swept by the vertical field into the trapping sites.

Thus, the present invention uses an approach that is in contrast to that of prior art which has charge traps, such as U.S. Pat. No. 5,633,178. In the prior art, the emphasis has been on retaining the charge as long as possible, and this reference for example specifically discloses using a refresh operation to keep the logic state. Accordingly, there is no effort made in the prior art to implement or sustain a dynamic process where charges are continually trapped and de-trapped. In fact conventional disclosures discourage such condition because it has been perceived to date as an undesirable situation, and so this explains, too, why such references do not describe configuring a FET channel to have a structure and doping characteristics that would facilitate this type of trapping/detrapping mechanism.

The drain current and therefore the negative differential resistance in this invention can be adjusted by varying the gate voltage as seen in FIG. 2. As seen also in FIG. 2, the invention can be seen as exploiting the fact that, as the threshold voltage $V_t$ dynamically increases (because of the accumulation of trapped charges) with increasing drain-to-source voltage $V_{DS}$, a drain current $I_{DS}$ (which is proportional to gate bias voltage $V_{GS}$ minus threshold voltage $V_t$) will first increase, and then begin to decrease as $V_t$ begins to exceed $V_{GS}$ and thus dominate the behavior of the device. Thus unlike conventional MOSFET current conduction curves 229 (indicated by the dashed curves), which rise and plateau at a steady maximum current with increasing drain-to-source voltage VDS, the current response curve for an NDR FET (e.g., curve 228) includes the standard operating region 210 (drain-to-source voltage VDS less than NDR threshold voltage VNDR) and the NDR operating region 220 (drain-to-source voltage VDS greater than NDR threshold voltage VNDR).

In region 210, current conduction curve 228 exhibits a steep rise as drain-to-source voltage VDS increases from zero, similar to the current response characteristics of conventional MOSFET transistors (e.g., curves 229). However, once the drain-to-source voltage VDS of the NDR FET exceeds NDR threshold voltage VNDR in region 220, the current conduction of the NDR FET rapidly drops back down to essentially zero as the increasing accumulation of trapped charge raises the threshold voltage of the NDR FET above the standard threshold voltage. In essence, the NDR FET is turned off once drain-to-source voltage VDS is slightly greater than NDR threshold voltage VNDR. The so-called "peak-to-valley ratio" or "PVR", (i.e., the ratio between the maximum current conduction during non-NDR operation (i.e., in region 210) and the minimum current conduction during NDR operation (i.e., in region 220)), which is a key figure of merit in NDR devices, can also be tuned in the present invention through suitable combinations of doping concentrations, device geometries and applied voltages. Peak-to-valley ratios in the range of one million and greater can be readily achieved for the NDR device 100 described with respect to FIG. 1.

The present invention bears some resemblance to a leaky (or volatile) floating gate storage device. However, the trapping and de-trapping of electrons in gate insulator 130 of NDR-MISFET 100 are very rapid processes, as compared to the programming and erase processes of a conventional floating-gate non-volatile memory device, so that the threshold voltage of NDR-MISFET 100 can respond dynamically to changes in a gate-to-source voltage and/or a drain-to-source voltage. In fact, while conventional memory devices require extensive pre-programming and erase cycle times to change threshold states, the threshold voltage of the present device responds to the applied source to drain bias voltage with minimal delay. Thus, it can change and reverse a threshold (and thus achieve an NDR mode) in substantially the same time as it takes for device 100 to turn the channel on or off in response to such bias conditions. For any given bias condition (fixed gate-to-source and drain-to-source voltages), a steady-state condition exists in which electrons are continually being rapidly trapped, stored, and de-trapped, maintaining a fixed amount of net charge trapped in gate insulator 130. The fixed amount of net charge trapped in the gate insulator is dependent on the particular voltage bias conditions applied to device 100. As the gate-to-source voltage and/or the drain-to-source voltage changes, the balance of the trapping and de-trapping processes changes, thereby changing the fixed amount of net charge trapped in the gate insulator and dynamically changing the threshold voltage. This means the net NDR effect can be controlled through two different bias parameters, a significant advantage again over conventional two terminal NDR devices. Furthermore, the negative differential resistance characteristic is seen not only as the drain-to-source voltage is increased from zero Volts to a high value (such that hot electrons are trapped in gate insulator 130), but also in the reverse direction as the drain-to-source voltage is decreased from a high value to zero Volts. It is expected, in fact that the threshold voltage variability/reversibility can be tailored to be relatively symmetric, so that it can thus be adjusted from a relatively low voltage value to a relatively high voltage value in approximately the same time required to adjust the threshold voltage from a relatively high voltage value to a relatively low voltage value.

As intimated above, the inventors believe that at higher drain to source voltages another feature of the present invention will be apparent, and that is the relatively high percentage of hot carriers in the channel current. Namely, since hot carriers are generated at a faster rate as the drain to source voltage increases the inventors believe that the net result is that eventually the hot carrier current component of the channel current will become dominant, and thus eventually constitute the only current component in the channel, even if it is extremely small overall. The relative percentage of hot carriers in the channel current, therefore, can be controlled, and this feature of the invention may be beneficial in other application environments.

Another aspect of the invention that is potentially useful is the fact that the trapping sites of the present invention can be thought of as introducing a form of current/charge delay on a single channel basis. The trapping time, temporary storage time, and detrapping time making up such delay can be controlled as a function of the applied horizontal and vertical electrical fields, and this aspect might be exploited in other environments.

As explained herein, the p-type dopant concentration in the surface region of the semiconductor underneath the gate electrode should be relatively high. This is to ensure that the vertical electric field is high (greater than $10^6$ V/cm) when the transistor is turned on, to promote the creation of hot electrons in the channel. A conventional NMOS transistor with channel length less than 250 nm may (in some applications) have such a high channel dopant concentration, but it will not achieve the results of the present invention because this structure alone is insufficient to bring about an NDR effect. In a preferred embodiment, the doping concentration is made slightly graded, so that the concentration of dopant is slightly lower at the semiconductor surface, and then peaks at some relatively small distance (below 30 nm) below the surface. This is done in order to achieve a built-in electric field, which in turn serves to confine electrons near the surface of the semiconductor, and thus further enhances the injection of electrons into the trapping sites in the dielectric. Again, other doping concentrations and techniques can also be employed to induce this same phenomenon.

Furthermore, to minimize the possibility of drain avalanche, a preferred embodiment herein teaches that the drain dopant-concentration profile at the junction with the channel is made to be relatively lightly doped. This not only minimizes the impact ionization current between the drain and the channel, but also has the side benefit of minimizing the capacitance between them. By minimizing the drain junction capacitance to the channel, the overall device switching performance is enhanced and the device thus operates faster. Those skilled in the art will appreciate that there are other ways to enhance the generation of hot electrons in the channel in addition to those described herein, and the present invention is not limited to any particular implementation of the same.

A preferred embodiment also confines the relatively high dopant concentration in the channel to the surface region only, so that the dopant concentration in the channel region is initially low (to confine electrons to the surface region), then increases, and then is made lower away from the surface to achieve the effect of low drain-junction capacitance. As alluded to earlier, the present invention is not limited to any particular doping concentration and profile of the dopant in the channel, because the range of such parameters necessary to bring about the NDR effect will vary from device to device of course, depending on the size, geometry, intended function, etc., of the device, but these details can be gleaned with routine and conventional simulation and testings for any particular application, in the same manner as is done for any other conventional semiconductor device. As explained previously, the high surface dopant concentration in the channel should also be offset from the highest dopant concentration in drain region 150 through the use of lightly doped drain (LDD) structures.

One additional and very desirable feature of the present invention is that the drain voltage at the onset of negative differential resistance can be scaled with the scaling of the CMOS technology. In other words, as the transistor channel length is reduced, the drain voltage required to reach the critical composite electric field in the channel (corresponding to the onset of negative differential resistance) is commensurately reduced. This aspect of the invention ensures that the structures and methods taught herein are guaranteed to have substantial and meaningful future utility in advanced generations of devices and products that are made using smaller geometries, lower bias conditions, etc. than those currently available.

Figure 3:
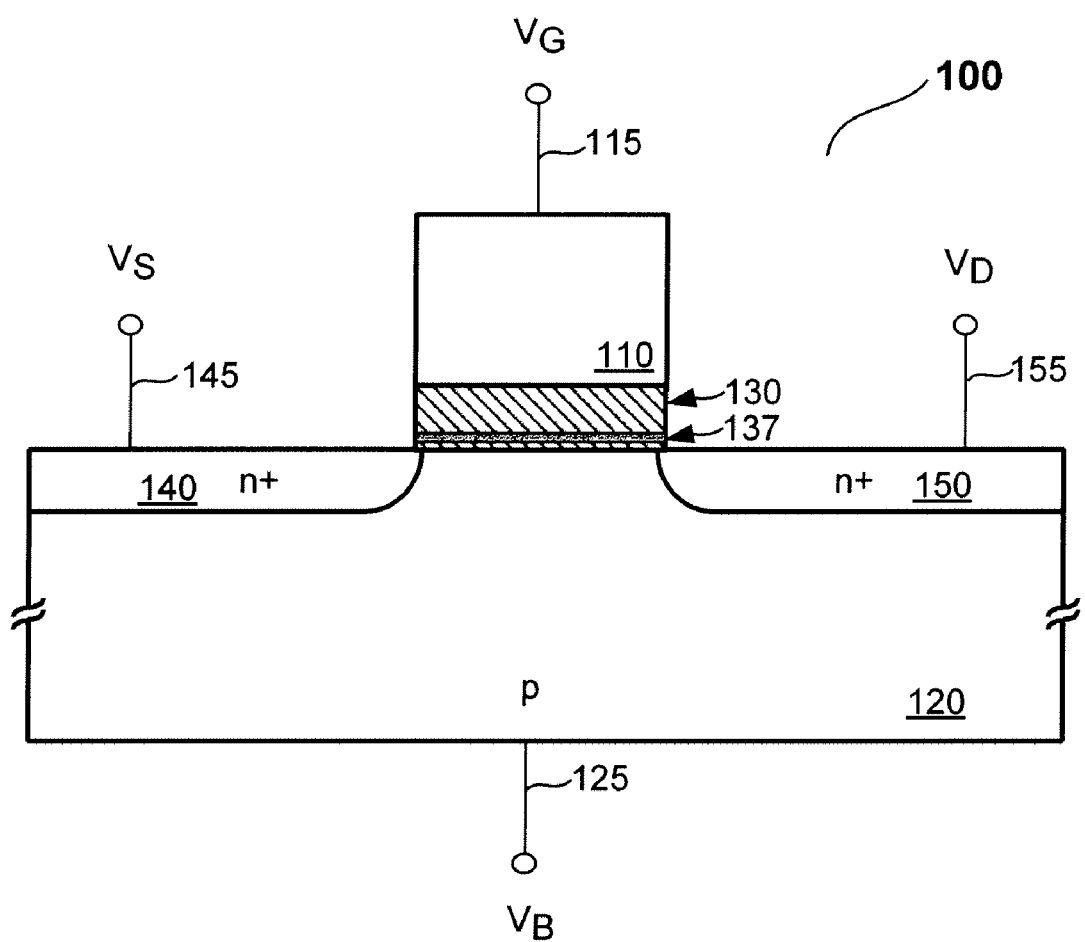
FIG. 3 is the schematic cross-sectional view of another embodiment of the NDR-MISFET disclosed in this invention including a body contact terminal 125 for receiving an NDR mode enable/disable bias signal.

As is evident, a key feature of NDR-MISFET 100 is that charge traps or storage nodes 135 exist in gate insulator 130, very near to (within 0.5 nm of) the semiconductor-insulator interface, so that electrons can be trapped and de-trapped very quickly. The creation and distribution/location of such traps 135 can be accomplished in any number of ways that are compatible with conventional semiconductor processing techniques. For example, traps 135 can consist of defect sites within gate dielectric 130 as shown in FIG. 1, or interfacial traps 135 between two or more layers of a multi-layered gate-insulator stack, or one or more electrically isolated ("floating") conductor or semiconductor electrodes 137 embedded within a gate insulator 130 (made up of two layers 130' and 130'' sandwiching the embedded electrode 137) as shown in FIG. 3. The only important consideration is that the carrier trapping sites are configured for trapping carriers that are electrically biased by an electrical control field (i.e., the combined effect of bias conditions resulting from the channel doping, the gate to source voltage, the source to drain voltage) to move from the channel into insulator/dielectric layer 130. This can be done in any number of different concentrations and arrangements within layer 130 so that the channel current can be varied all the way from essentially zero (no conduction) to full conduction in accordance with the strength of the electrical control field.

In a preferred embodiment of the present invention, Boron atoms incorporated into gate insulator 130 during a thermal oxidation of heavily boron-doped silicon serve to provide defect sites which readily trap charge. Alternative embodiments may employ alternative dopant species such as Indium to form charge traps 135, and the present invention is not limited to any particular dopant species in this regard.

As mentioned, other possible embodiments may employ a multi-layered gate insulator, for example a very thin interfacial layer of silicon dioxide and a thicker layer of a second dielectric material such as silicon nitride, with charge-trapping sites at the dielectric-dielectric interface. Further possible embodiments may incorporate islands of metal, silicon or germanium nanocrystals embedded within gate insulator, or perhaps even a single continuous floating gate electrode (FIG. 3) 137, to trap charge. In fact, the present approach can be taken to an extreme to effectuate a new type of non-volatile floating gate electrode for a flash memory cell. It can be seen that complete non-volatility can be achieved by simply locating the trapping sites sufficiently far away from the interface so that the charge does not leak off after it is put there (using conventional programming techniques). This type of discontinuous floating gate electrode, formed as a multitude of trapping sites distributed in the gate dielectric, may have significant operating advantages over conventional continuous electrode. In particular, in the distributed charge storage sites aspect of the present invention, the trapped charge has less mobility than an electron in a sheet type electrode, and thus the charge storage sites are less likely to leak the stored charge (individually and in the aggregate of course) to the source/drain regions. This in turn means that the charge storage sites can be located closer to the channel, and thus the gate insulating layer can be thinner, the programming voltage and/or current smaller, etc. Other methods and techniques for creating and distributing traps 135 in a fashion suitable for achieving an NDR effect, and any non-volatile effects as shown herein will be apparent to those skilled in the art from the present teachings, and can be further gleaned from the descriptions given in the aforementioned prior art references for creating different types and arrangements of charge traps.

To enhance the electron trapping stemming from the generation of hot electrons in the channel (since it is the primary mechanism responsible for the negative differential resistance characteristic) the present disclosure also teaches a preferred embodiment of an insulator 130 for retaining the trapped charge under high gate-voltage bias. To avoid the loss of trapped electrons to gate electrode 110 via tunneling through gate insulator 130, the latter should have sufficient thickness to prevent or at least substantially reduce such tunneling effects. In a preferred embodiment insulator 130 is silicon dioxide formed by either one of, or a combination of conventional thermal oxidation and deposition techniques. As referred to earlier, to avoid significant loss of trapped charge due to quantum-mechanical tunneling, gate insulator 130 is formed to have a thickness of at least 2 nm. Other implementations of insulator material for layer 130 include Silicon Nitride ($Si_3N_4$), or Silicon Oxynitride ($SiO_xN_y$), or a high-permittivity dielectric (relative permittivity greater than 8). The use of a high-permittivity gate dielectric is advantageous for achieving high area gate capacitance, which facilitates adequate gate control of the channel potential. Again, the present invention is not restricted to any particular selection of thickness and material for insulator layer 130, and other variations/techniques for achieving a reduction in quantum-mechanical tunneling known in the art can be used to the extent they are compatible with the present objectives.

For a preferred embodiment of this invention, polycrystalline silicon (poly-Si) is used as the material for gate-electrode 110. Other possible embodiments may utilize alternative gate materials such as polycrystalline silicon-germanium or metals, or any number of other conventional materials.

An exemplary process for fabricating the NDR-MISFET in a conventional CMOS fabrication facility is depicted in FIG. 4. A standard p-type silicon starting substrate 120 is first processed through standard isolation-structure-formation process steps; the surface of substrate 120 is then moderately doped (to ~$5\times10^{18}$ $cm^{-3}$) by a shallow Boron implant. Subsequent to this a deposition of silicon dioxide (~3 nm) is done (or thermal oxidation) in a manner so that the Boron becomes incorporated into a gate insulator 130 near the surface of silicon substrate 120. The resultant dopant concentration in the Si channel near the surface is several times lower than it is directly after the implant step above, due to segregation of Boron into gate insulator 130. As noted earlier, the Boron dopant then acts effectively as an electron trap during operation of device 100. In contrast to some of the prior art implantation techniques discussed earlier, the oxidation step appears to incorporate the Boron in a manner that facilitates shallow electron traps, making it easier for charge to move in and out of gate insulator 130.

Next, polycrystalline silicon is deposited and patterned to form gate electrode 110. N-type dopant ions such as Arsenic are subsequently implanted at moderate dose to form the lightly doped source/drain regions self-aligned to gate 110, after which sidewall spacers (not shown) are formed by conformal deposition and anisotropic etching of an insulating layer such as silicon nitride. Deep source/drain contact regions 140 and 150 are then formed by ion implantation of Arsenic or Phosphorus and thermal annealing to activate the dopants. Device fabrication is completed with standard passivation, contact and metallization processes. While not explicitly shown, it is apparent, because only conventional processing is required, that other CMOS devices can be formed in the same mask with the present NDR device 100, so that, for example, memory and logic circuits can be formed at the same time as the present device, and thus integrated directly to form a conventional CMOS circuit having NDR capability. While the above is explained with reference to a CMOS process, it will be appreciated by those skilled in the art that other types of starting semiconductor materials could also be used instead. Suitable and/or optimal processing conditions for achieving the NDR mode in any particular CMOS compatible environment will be easily designed and determined by those skilled in the art through conventional modeling and experimentation techniques.

As a final note it is preferable that during normal operation of device 100 that a body contact ($V_B$) should be electrically biased (e.g. at a fixed potential of 0 Volts, as is typical for n-channel MOSFETS). If body terminal ($V_B$) is not connected (i.e. is "floating") then the NDR behavior may be drastically diminished or even eliminated. This is because holes which are generated by hot electrons will accumulate at the channel-to-source junction, forward biasing the junction and effectively reducing the transistor threshold voltage (counteracting the charge-trapping effect of increasing the threshold voltage), if the holes are not allowed to flow out of the channel region through the body contact. Thus, if NDR-MISFET 100 is implemented in a silicon-on-insulator substrate, or in a thin film of polycrystalline silicon, care should be taken to provide a body contact. This aspect of the invention can also be exploited of course for certain applications, where it may be potentially useful to be able to turn on or turn off the NDR mode by connecting or disconnecting (switching) a bias voltage to body terminal $V_B$, respectively.

With the prior art, even if a device exhibiting adequate negative differential resistance can be produced, it is still a daunting task to integrate such a device into a conventional CMOS process. Since the device in this invention is inherently an NMOS structure, integration of this device with conventional logic CMOS devices is straightforward. The illustrative flow in FIG. 4 allows an NDR device process module to be completely de-coupled from a conventional process, to allow for independent optimization of the NDR devices and the CMOS devices. This makes it more straightforward to scale the NDR device in this invention with future generations of CMOS integrated-circuit technology.

Additional Processing Variations

Theoretical analyses performed by the inventors indicate that the following conditions and additional process details can be sufficient to achieve an NDR FET in a deep-submicron CMOS technology. In particular, our results show that a peak electric field in the channel on the order of 0.5 MV/cm or higher is preferable. Furthermore, we have also discovered that water ($H_2O$) or Hydrogen can be used to form the aforementioned charge traps, in addition to the other species noted earlier. In a preferred approach, hydrogen-related traps are formed by oxidation of heavily boron doped Si followed by a subsequent anneal in a steam ambient or a hydrogen ion implantation step and a subsequent thermal annealing step. It is believed (but has not been confirmed) that the boron assists in the formation of hydrogen-related traps.

In addition, it is further preferable, for at least some geometries, to not use structures that may inhibit the generation of hot carriers in the channel, or significantly reduce the peak electric field. For example, some forms of conventional lightly doped drain (LDD) structures can impede the generation of such carriers, particularly if they are formed prior to the channel doping noted above.

Furthermore, in the discussions above pertaining to the preferred level of p-type dopant concentration in the channel, it will be understood by those skilled in the art that this refers to a "net" p type concentration level, and not the actual absolute value that might be implanted during any particular processing step, or which might be present during any intermediate step. In other words, regardless of the intervening doping operations, the present invention can be implemented in any fashion so long as the final p-type dopant concentration in the channel is on the order of $1 \times 10^{18}$ cm$^{-3}$ or higher, because this permits an appropriate electric field strength to be generated in the channel. In fact, as is apparent from the above, the onset of the NDR behavior can be controlled as well by appropriate tailoring of the channel doping concentration as well. It should be noted that these figures are merely preferable for existing geometries, and that other suitable values will be determinable by those skilled in the art for other geometries, structures, etc., based on the present teachings and other well-known techniques.

In another variation, a preferred embodiment of the present invention can also include a counter-doping step to tailor the NDR FET threshold voltage. In one embodiment, the NDR FET can be produced with a negative standard threshold voltage. The counter-doping step can be performed after the channel doping operation noted earlier to reduce the net p-type concentration in the channel. A higher level of Boron (greater than $5 \times 10^{18}$ cm$^{-3}$) may be desirable for some architectures implemented in deep submicron technologies. Conventional thermal annealing is also preferably employed to help incorporate some of the Boron into the gate dielectric so that it will facilitate the creation of appropriately configured trapping sites.

In yet another variation, although it is preferable in some substrates and applications that the body of the NDR FET be biased (e.g. at 0 V) to minimize the "floating body" effect, it is possible to tailor the design of the NDR FET to ensure that NDR behavior is maintained in the absence of a body bias. For example, the body thickness can be made sufficiently thin so as to be fully depleted, to minimize the accumulation of holes at the channel-to-source junction. Thus, it is possible to implement the NDR FET using a silicon-on-insulator (SOI) substrate, without providing a body contact, for compact integration. Compatibility with SOI substrates is a useful feature, since such substrates will increasingly be used in IC manufacturing to achieve higher circuit operation speeds with lower power consumption, due to significant reductions in interconnect and junction capacitance.

As discussed above, a preferred primary mechanism for achieving NDR behavior in an insulated gate field-effect transistor is to trap energetic ("hot") carriers from a channel. The traps should be configured preferably so that a trap energy level should be higher than the semiconductor conduction band edge, in order for it to primarily (if not exclusively) trap hot carriers. For example, a trap which is energetically located 0.5 eV above the semiconductor conduction band edge can only trap electrons from the semiconductor which have kinetic energy equal to or greater than 0.5 eV. For high-speed NDR FET operation, it is desirable to have the carrier trapping and de-trapping processes occur as quickly as possible. As described in the above preferred embodiment, this result is achieved by placing traps in close proximity to the channel, i.e. within 0.5 nm of the gate-dielectric/semiconductor interface as previously stated.

A similar (if not superior in most cases) result would result if the traps were located right at the interface itself. In this regard it should be noted that interface traps which are energetically located well above the semiconductor conduction band edge will have no effect on FET performance until a significant percentage of the mobile carriers in the channel have sufficient kinetic energy to become trapped. The formation of such interface traps would also be preferable from a process integration standpoint, because it would eliminate the need to selectively form a separate trap-containing dielectric layer in the NDR FET regions of the semiconductor surface. Accordingly, in such instance an appropriate dopant or ion species (of the type mentioned earlier) could be implanted/diffused to position the traps in such interface region instead. The particulars of such implantation and/or diffusion operations will vary from implementation to implementation of course based on the particular geometry, layer compositions, layer thicknesses, desired trap characteristics, desired trap locations, etc., and thus the appropriate process parameters, including ion implantation energies and species will be easily determined through routine optimization by those skilled in the art.

Another apparent observation from the present teachings is the fact that devices employing the present invention utilize a type of tunneling to a charge "trap", and not tunneling to a conduction band per se as required in conventional NDR devices such as tunnel diodes. All that is required is that the carriers be given sufficient energy to penetrate the semiconductor-insulator interface potential barrier, and then be trapped by traps within one or more dielectric layers (including any or all of the $SiO_2$, $SiO_xN_y$ and $Si_3N_4$ layers mentioned above). Thus, it is not necessary to set up a complicated set of precisely tuned layers in a particular fashion to achieve a continuous set of conduction bands as required in conventional NDR devices, and this is another reason why the present invention is expected to achieve more widespread use than competing technologies.

As an additional variation, the NDR FET of the present invention can be used to eliminate the need for p-channel transistors in low-power memory and logic circuits, including for example in an SRAM cell or in an inverter. In this regard, the invention provides the capability to implement low-power memory and/or logic functions using an all-NMOS (only n-channel devices) technology. Conventional CMOS technology requires significantly higher process complexity than an all-NMOS technology because of the need to define separate, electrically isolated n-type and p-type well regions, as well as separate n-type and p-type source/drain extension and contact regions. The present invention therefore provides the means to achieve more compact, simpler and overall less expensive circuit architectures and manufacturing processes.

While prior art devices (including memory cells) using single-type transistors are well-known, such devices have typically used either an active or passive load device, including for example a transistor and/or an implanted resistor or thin film resistor. The primary disadvantages of these past approaches are:

1. Significant static power dissipation
2. Reduced output voltage swing (difference between "high" and "low" values of output voltage)

Furthermore, some prior art NDR devices have been proposed as load devices for an SRAM cell (see U.S. Pat. No. 6,294,412 which is incorporated by reference herein) to reduce overall cell size, but these implementations have been limited to two terminal tunneling diodes, which require a specialized sequence of processing steps and hence would increase the complexity and cost of the IC fabrication process.

In contrast, in the present invention, an NDR FET does not require any non-standard processes and only requires that an additional signal line be provided to control a gate of such FET as noted above. Furthermore, since a channel region of the NDR FET uses a dopant common to a conventional insulated gate field effect transistor (IGFET), i.e., such as an n-type channel, these features can be formed at the same time during a manufacturing process.

Accordingly, a very beneficial use of the NDR FET of the present invention would include as a substitute for the NDR devices of an SRAM memory cell of the type noted in FIGS. 1a and 1b of U.S. Pat. No. 6,294,412 noted earlier, as either a pull-down or pull-up element in series with an appropriately biased IGFET. In such an embodiment, structural features critical to the operation of an IGFET shown therein, including for example, a gate insulation layer, source/drain regions, isolation regions, contacts, gate electrodes, etc., formed in a semiconductor die/wafer can all be formed at the same time during common operations and thus shared with an NDR FET of the present invention. From a process integration perspective, the present approach provides a substantial advantage, therefore, over mixed process load technologies.

Figure 5:
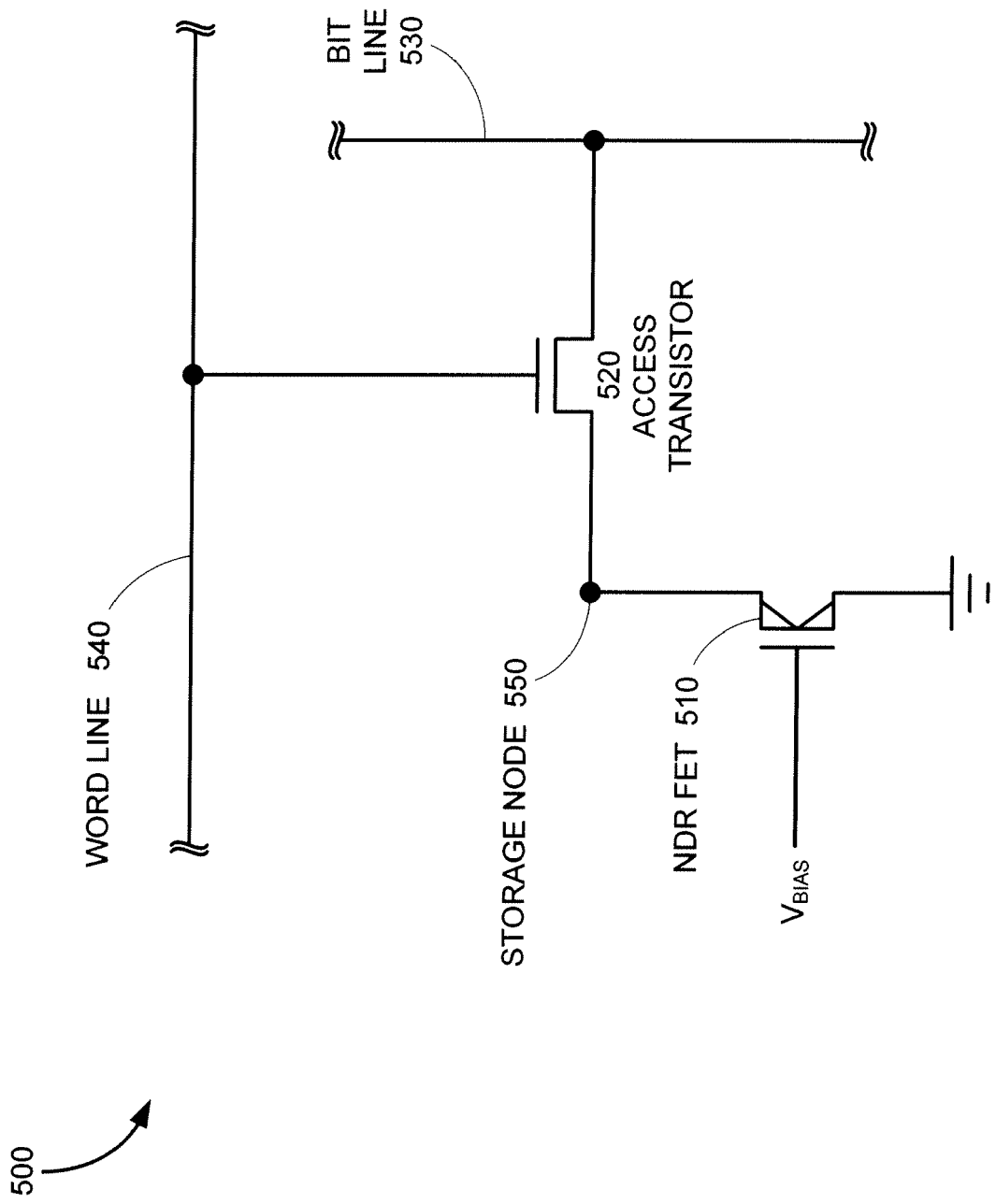
FIG. 5 is a circuit diagram of two (2) transistor SRAM cell formed by a combination of an NDR FET and a conventional FET.

Referring to FIG. 5, therefore, a preferred embodiment of a 2T SRAM cell 500 uses an NDR FET 510 including a gate electrode that is biased by an input signal Vbias (which can be fixed, or can be clocked). An NDR FET source is biased at a low potential Vss (e.g. 0V, or ground); its drain is connected to one of the source/drain terminals of an n-channel access transistor 520. The other source/drain terminal of access transistor 520 is connected to a data (bit) line 530. The gate of access transistor 520 is connected to a word line 540. Thus, such 2T SRAM cell requires four input/output lines: Vss, Vbias, WORD, BIT. Data is stored at node 550 shared by NDR FET 510 and access transistor 520.

To write data into cell 500, BIT line 530 is driven to an appropriate logic level (HI or LO, e.g. corresponding to a power supply Vdd or Vss, respectively), and then WORD line 540 is pulsed to a high voltage (e.g. Vdd+Vt, where Vt is the threshold voltage of the access transistor 520). If the data to be written is HI, then storage node (SN) 550 is charged to the HI level through access transistor 520, and thereafter no current flows through the NDR FET 510 because its drain-to-source voltage $V_{DS}$ is zero. If the data to be written is LO, then SN 550 will be discharged to Vss, and NDR FET 510 enters the NDR mode and hence turns off.

Thus, once data is written onto SN 550, the NDR FET 510 conducts very little or no current to achieve low standby power consumption. A pulse width (in units of time) of a WORD line voltage pulse should be wide enough to allow SN 550 to be charged fully to the HI level, or discharged fully to the LO level, and to allow NDR FET 510 to switch from NDR mode to non-NDR mode or vice versa. Accordingly the pulse width will vary of course from circuit to circuit and can be determined in accordance with well-known techniques.

To read data from cell 500, BIT line 530 is preferably precharged to the HI level, and then connected to the input of a conventional sense amplifier (not shown). WORD line 540 is then pulsed to a high voltage. If the data stored is HI, then SN 550 will not pull down the voltage on BIT line 530 through access transistor 520. If the data stored is LOW, then SN 550 will pull down the voltage on BIT line 530 through access transistor 520. As the BIT line voltage is pulled down, the voltage on SN 550 will rise, so that NDR FET 510 will turn on and help pull the BIT line voltage down through access transistor 520.

A sense amplifier can be designed through any conventional techniques to quickly detect (within nanoseconds) whether or not the BIT line voltage is being pulled down, and then amplify the data signal (e.g. outputs a voltage Vss if it detects that the BIT line voltage is dropping, otherwise maintains a high output voltage).

It should be noted that for fast data sensing (within 1 ns), a differential amplifier (requiring 2 inputs instead of 1) is preferable. In such cases a neighboring BIT line or "dummy" BIT line can be precharged to an appropriate level (e.g. Vdd/2) and used to provide the second input signal to the differential sense amplifier.

To compensate for potential leakage current and/or alpha-particle strikes, a periodic refresh can be performed to ensure that any HI voltages do not degrade with time.

It will be apparent to those skilled in the art the aforementioned NDR device can be advantageously employed in both memory and logic applications, and in the types of circuits as described in the prior art, i.e., as a memory device, as part of a logic circuit, a self-latching logic device, an amplifier, an oscillator, power management, and many other environments where its useful characteristics can be exploited.

DRAM Cell with NDR Pull-up Element

As noted above, a conventional DRAM device requires a refresh operation to maintain the state of data values stored in such device. The refresh operation in turn requires a significant amount of additional circuitry "overhead" to implement. The complexity of this refresh circuitry is based in large part on the need to prevent refresh operations from occurring at the same time as a read or write operation (simultaneous refresh/read operations or refresh/write operations can result in corrupted data). Moreover, the refresh operation consumes power and restricts the bandwidth/throughput of a DRAM device, since the latter is inaccessible for a read/write operation during such refresh periods.

Figure 6A:
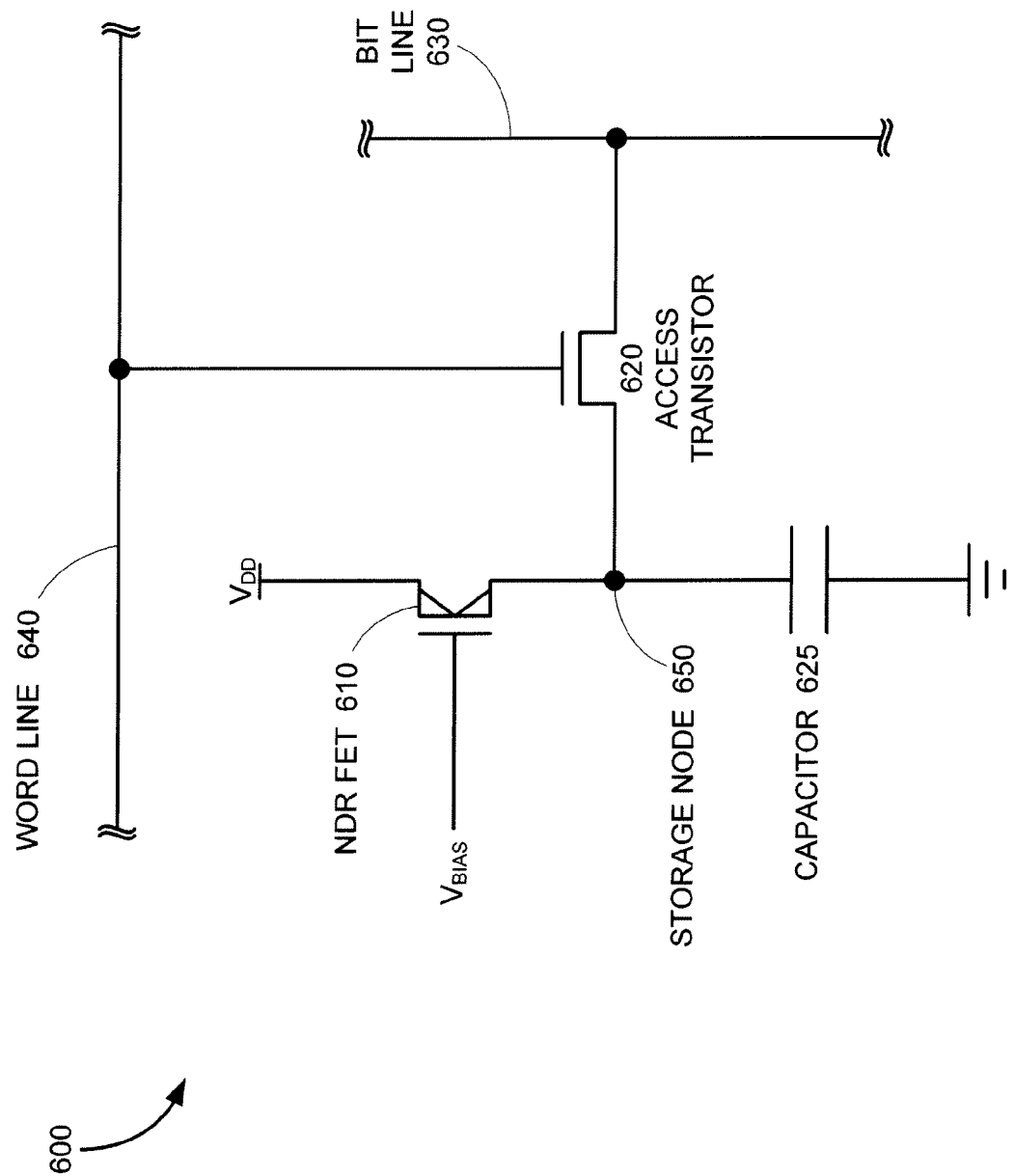
FIG. 6A is a circuit diagram of a memory cell incorporating an NDR FET pull-up element.

A memory cell 600 incorporating a simplified refresh operation is depicted in FIG. 6A. Note that for explanatory purposes, memory cell 600 is designated as a "dynamic" memory cell due to the structural similarities with a conventional DRAM cell. Note, however, that this is merely a convenient simplified pedagogical label, and that memory cell 600 can be considered instead as a type of hybrid between a DRAM and an SRAM cell, and/or as a pseudo-static type of cell since the "refresh" operation takes place internally within the cell. The particular terminology is again not critical to the present invention, and the benefits of the present teachings will be understood by those skilled in the art to be useful in any memory application where it is necessary to maintain a cell storage node at a particular potential, and to compensate for cell leakage.

Unless otherwise noted, like numbered structures in FIG. 6A are intended to be substantially similar those already discussed in FIG. 5. Thus, in one embodiment, DRAM cell 600 includes an NDR FET 610, an access transistor 620, and a capacitor 625. NDR FET 610 and capacitor 625 are connected in series between a high voltage supply terminal (e.g., the nominal cell operating voltage; i.e., upper supply voltage $V_{DD}$) and ground (i.e., the lower (ground) supply voltage $V_{SS}$), and access transistor 620 is connected between a bit (data) line 630 and a storage node 650 at the junction between NDR FET 610 and capacitor 625. In one embodiment, NDR FET 610 and access transistor 620 can share a terminal (i.e., a common source/drain terminal). In another embodiment, NDR FET 610 and access transistor 620 may be formed on an SOI substrate. Note that while access transistor 620 is depicted and described as being an n-channel device for exemplary purposes, in various other embodiments access transistor 620 can be formed as a p-channel device.

The gate of access transistor 620 is connected to a word line 640, while the gate of NDR FET 610 is coupled to receive a pulsed gate bias signal VBIAS (described in greater detail below). Capacitor 625 can be any type of well-known device used for DRAM cells, such as a planar type capacitor, a crown type capacitor, a trench pillar type capacitor, and a fin/cylinder type capacitor, among others. In one embodiment, capacitor 625 can be formed in the metal (and dielectric) layers above the bit line 630 (e.g., "stacked-capacitor" DRAM construction).

To write data into memory cell 600, bit line 630 is driven to an appropriate logic level (i.e., either a logic HIGH level or a logic LOW level, which typically correspond to an upper supply voltage $V_{DD}$ and a lower supply voltage $V_{SS}$ (ground), respectively), and normally LOW word line 640 is pulsed to a logic HIGH voltage (e.g., to upper supply voltage $V_{DD}$). The logic HIGH pulse on word line 640 turns on access transistor 620, thereby allowing the logic level on bit line 630 to be stored on capacitor 625. If access transistor 620 is a p-channel device, then the word line 640 is normally HIGH and pulsed to a logic LOW voltage to write data into memory cell 600. Thus, if the data to be written into memory cell 600 is a logical "1" (i.e., a logic HIGH level), then bit line 630 charges capacitor 625 (if necessary) to the logic HIGH level through access transistor 620 (just as in a conventional DRAM cell), so that the logic HIGH state is maintained at storage node (SN) 650. Similarly, if the data to be written into memory cell 600 is a logical "0" (i.e., a logic LOW level), then bit line 630 discharges capacitor 625 (if necessary) to the logic LOW level through access transistor 620.

During operation of memory cell 600, NDR FET 610, in response to pulsed gate bias signal $V_{BIAS}$, ensures that the desired logic level is maintained at storage node 650. Pulsed gate bias signal $V_{BIAS}$ is a normally LOW signal that is pulsed to a high-bias level at predetermined intervals. (As is known in the art, the "gate bias" for a FET represents the gate voltage relative to the source voltage of the FET, i.e., Vg minus Vs.) When pulsed gate bias signal VBIAS is at a logic LOW level, the gate-source voltage potential for NDR FET 610 is insufficient to create an inversion layer in the channel region of NDR FET 610, thereby ensuring that NDR FET 610 remains off. Thus, while pulsed gate bias signal $V_{BIAS}$ is at a logic LOW level, NDR FET 610 has no effect on the data stored in memory cell 600.

The high-bias level of pulsed gate bias signal VBIAS can be any voltage level greater than the standard threshold voltage of NDR FET 610 (i.e., the threshold voltage while operating in the standard operating region (region 210 in FIG. 2)). For example, in one embodiment, the high-bias level may be the standard threshold voltage of NDR FET 610 plus one half to one volt. Note that the high-bias level may be reduced by producing NDR FET 610 with a negative standard threshold voltage. In another embodiment, the high-bias level may be the upper supply voltage VDD. In any case, when pulsed gate bias signal $V_{BIAS}$ is pulsed to the high-bias level, the behavior of NDR FET 610 depends on the data value stored at SN 650 (i.e., the voltage stored on capacitor 625).

For example, if a logic HIGH voltage is stored on capacitor 615, NDR FET 610 will exhibit a relatively low drain-to-source voltage $V_{DS}$, and the high-bias level of gate bias signal VBIAS will cause NDR FET 610 to operate in the standard operating region 210 (i.e., the current conducting behavior to the left of NDR threshold voltage VNDR shown in FIG. 2). Thus, if the voltage on capacitor 615 decreases from the nominal logic HIGH voltage (e.g., due to leakage current through access transistor 620), the drain-to-source voltage VDS of NDR FET 610 will exhibit a corresponding increase, which in turn will cause NDR FET 610 to turn on (i.e., cause NDR FET 610 to conduct a relatively large current) to recharge capacitor 615, thereby maintaining the desired logic HIGH voltage at SN 650.

Note that as indicated by the current response curves in FIG. 2 (e.g., curve 228), the current flow through NDR FET 610 rapidly increases with increasing drain-to-source voltage VDS. Therefore, the more the stored voltage deviates from the desired logic HIGH level (i.e., the greater the charge leakage from capacitor 615), the greater the current flow through NDR FET 610 that will occur during a high-bias pulse of pulsed gate bias signal VBIAS, and the faster capacitor 615 will be recharged.

On the other hand, if a logic LOW level is stored at SN 650, the drain-to-source voltage VDS of NDR FET 610 is relatively high. Therefore, NDR FET 610 will operate in the NDR operating region 220 (i.e., the region to the right of NDR threshold voltage VNDR in FIG. 2), and will conduct a minimal amount of current regardless of the state of pulsed gate bias signal VBIAS (i.e., NDR FET 610 is turned off by the relatively large drain-to-source voltage VDS). Therefore, a logic LOW voltage stored on capacitor 615 will remain relatively unchanged even as pulsed gate bias signal VBIAS switches between logic LOW and the high-bias levels at the gate of NDR FET 610.

As is known in the art, even when a transistor is turned off, a small amount of leakage current generally flows through the transistor. For example, in the NDR operating region 220 shown in FIG. 2, a small amount of current flows through the NDR device even when the drain-source voltage VDS is significantly larger than the NDR threshold voltage $V_{NDR}$. Therefore, a transistor is generally considered to be turned off (i.e., in an OFF state) when the current flow through the transistor is less than 5% of the maximum (peak) current for that transistor when it is turned on (i.e., in an ON state).

Appropriate engineering of NDR FET 610 can be used to ensure that leakage current through NDR FET 610 (during the OFF state) does not charge up storage node 650 from a stored "0" to a stored "1" in response to the high-bias level pulses of the gate bias signal $V_{BIAS}$. Note that in most instances, a leakage characteristic of capacitor 650 will be greater than a leakage behavior of NDR FET 610 when the latter is turned off, so the leakage characteristic of NDR FET 610 will typically not be a significant issue. However, in various other embodiments, a variety of techniques can be used to compensate for potential leakage current through the NDR FET 610 when it is off. For example, the magnitude of upper supply voltage $V_{DD}$ could be increased, at least during storage periods, so that the NDR effect is enhanced and conduction in the channel is substantially eliminated. Alternatively, the transistor characteristics of transfer FET 620 and NDR FET 610 (channel lengths and gate sizings, dopings, etc.), and the leakage behavior of capacitor 625 can be tailored and matched to compensate for any leakage through NDR FET 610. In other words, the other elements in cell 600 can have a leakage characteristic which mirrors that of NDR FET 610 but in an opposite fashion, so that as NDR FET 610 "leaks" charge to storage node 650 at a particular rate in an OFF state, the other elements similarly leak such charge to other paths at an equivalent rate. Again, the specific implementation details will vary from device to device and can be determined using routine design techniques.

In this manner, NDR FET 610 ensures that the desired data is maintained within memory cell 600. Note that due to the high PVR of NDR FET 610, the high-bias pulses in pulsed gate bias signal VBIAS need only be a very small fraction of the total pulsed gate bias signal VBIAS. In other words, because a very high current can be conducted by NDR FET 610 when pulsed gate bias signal VBIAS is pulsed to its high-bias level, the actual length of time at which pulsed gate bias signal VBIAS must remain in that high-bias level can be relatively short. For example, if NDR FET 610 has a PVR of about one million, a nanosecond-long high-bias pulse provided once every millisecond as pulsed gate bias signal VBIAS can provide ample refresh capabilities for memory cell 600.

Note that cell 600 can be considered a form of pseudo static memory cell, since a type of "refresh" occurs within the cell itself. In essence, this is an NDR based refresh that is more efficient since it is done on a cell by cell basis. Also, the NDR based refresh is designed to be switched off and not take place when memory cell 600 is storing a low voltage potential at storage node 650. Moreover, as is apparent from the present teachings, the "refresh" of the present invention does not require a separate cycle. The typical refresh cycle is a dedicated time interval that can interfere with desired read/write operations, and thus the lack of the same in embodiments of the invention increases the transfer bandwidth of a memory device.

For example, if a read/write operation is performed while pulsed gate bias signal VBIAS is at a logic LOW level, NDR FET 610 will be off and will have no effect on the read/write operation. Furthermore, even if the read/write operation happens to coincide with a logic HIGH pulse of pulsed gate bias signal VBIAS, the NDR behavior of NDR FET 610 will still ensure that the read/write operation is performed successfully.

Alternatively, if a logic HIGH voltage is originally stored on capacitor 615 and a logic LOW value is subsequently written into memory cell 600, NDR FET 610 could potentially be turned on during that logic LOW write operation (i.e., if some charge leakage has occurred from capacitor 615 and pulsed gate bias signal VBIAS is in a logic HIGH state when access transistor 620 is turned on). However, as soon as access transistor 620 couples the logic LOW voltage on bit line 630 to storage node 650 (and hence, to the source of NDR FET 610), the drain-to-source voltage of NDR FET 610 is increased above the NDR threshold voltage (shown in FIG. 2), and NDR FET 610 switches to the NDR mode of operation which turns off NDR FET 610 to minimize current conduction. Capacitor 615 can then be discharged through access transistor 620, and the desired logic LOW level can be stored in memory cell 600.

On the other hand, if a logic LOW voltage is originally stored on capacitor 615 and a logic HIGH value is subsequently written into memory cell 600, NDR FET 610 could actually be turned on during the write operation. Specifically, as capacitor 615 is being charged during the write operation, the source voltage for NDR FET 610 is increasing (and the drain-to-source voltage VDS of NDR FET 610 is decreasing). If pulsed gate bias signal VBIAS is pulsed HIGH once the drain-to-source voltage VDS drops below NDR threshold voltage VNDR, NDR FET 610 will turn on and begin conducting a relatively large current. Therefore, NDR FET 610 can actually improve the write speed in certain situations for memory cell 600.

Figure 6B:
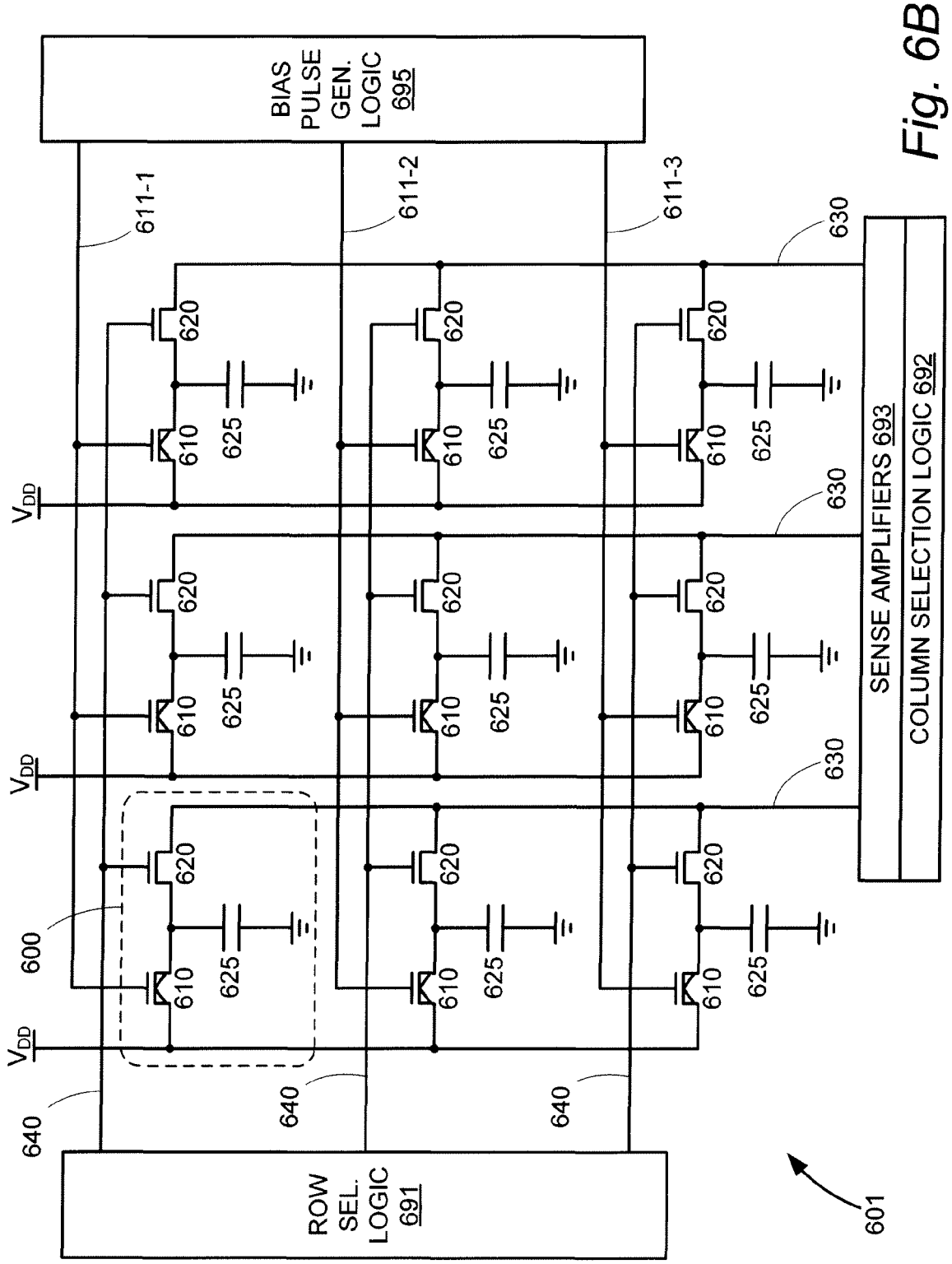
FIG. 6B is a circuit diagram of memory array including the memory cell of FIG. 6A.

Thus, because the operation of NDR FET 610 does not (negatively) affect the overall operation of memory cell 600, NDR FET 610 beneficially eliminates the need for the complex refresh circuitry and logic required by conventional DRAM memories. For example, FIG. 6B shows a schematic diagram of a memory array 601 that incorporates memory cell 600 shown in FIG. 6A. Memory array 601 includes nine memory cells 600 in a 3×3 array. The source (or drain) of each access transistor 620 in each memory cell 600 is connected to a bit line 630, while the gate of each access transistor is connected to a word line 640. Row selection logic (circuit) 691 applies appropriate signals to word lines 640 to provide read/write access to particular rows of memory cells 600, and column selection logic (circuit) 692 supplies appropriate logic levels to bit lines 630 to enable the reading and writing of particular memory cells 600. Sense amplifiers 693 are coupled to bit lines 630 for use during read operations on memory cells 600 (described in greater detail below).

The drain of each NDR FET 610 in each memory cell 600 is connected to supply voltage VDD, while the gate of each NDR FET 610 is connected to a bias line 611. In lieu of the complex refresh circuitry present in conventional DRAM arrays, memory array 601 includes a simple bias pulse generation logic (circuit) 695 that provides pulsed gate bias signal VBIAS (as described with respect to FIG. 6A) to bias lines 611. As noted above, NDR FETs 610 in each of memory cells 600 can be operated without regard to the read/write behavior of memory array 601. Therefore, bias pulse generation logic 695 can be implemented in any manner that provides periodic logic HIGH pulses on bias lines 611. For example, in one embodiment, bias pulse generation logic 695 could be implemented as a shift register that simply applies a bias pulse to bias lines 611 in a sequential loop (i.e., applying the bias pulse to bias lines 611-1, 611-2, and 611-3, looping back to bias line 611-1, and continuing in this manner). Various other bias pulse generation circuits will be readily apparent.

Note that the particular arrangement and orientation of memory cells 600 within memory array 601 is merely exemplary, and that a memory array in accordance with the invention can include any number of memory cells 600 in any arrangement. For example, in one embodiment, adjacent columns of memory cells 600 can be mirror images of one another, thereby allowing the source terminals of the NDR FETs 610 in each of the memory cells 600 to be tied to a common supply voltage line. In another embodiment, bias pulse generation logic 695, which is depicted as providing common signals to each row of memory cells 600 (i.e., via horizontal bias lines 611-1, 611-2, and 611-3), can provide common signals to each column of memory cells 600 (e.g., via vertical bias lines), or to any other desired grouping breakdown for memory array 601.

Thus, while each memory cell 600 includes more active components (one more) than a conventional DRAM cell, memory cells 600 obviate the need for conventional refresh circuitry in memory array 601. In some applications, of course, it may be desirable to mix and match the memory cells of the present invention with conventional DRAM cells that do utilize a standard refresh operation.

During write operations, a pulse width (in units of time) of a word line voltage pulse should be wide enough to allow a capacitor 615 to be charged fully to the logic HIGH level, or discharged fully to the logic LOW level, and to allow NDR FET 610 to switch from NDR mode to non-NDR mode or vice versa. Accordingly the word line pulse width will vary of course from circuit to circuit and can be determined in accordance with well-known techniques.

To read data from a given memory cell 600, the appropriate bit line 630 can be precharged to a logic HIGH level, and then connected to the input of one of sense amplifiers 693 by column selection logic 692. The appropriate word line 640 is then pulsed to a logic HIGH level. If the data being stored is a logic HIGH value, then capacitor 615 will not pull down the voltage on BIT line 630 through access transistor 620. If the data being stored is a logic LOW value, then capacitor 615 will pull down the voltage on BIT line 630 through access transistor 620.

Sense amplifiers 693 can exhibit any conventional design/configuration that quickly detects (within nanoseconds) whether or not the voltage(s) on bit line(s) 630 is being pulled down, and then amplify the data signal(s) appropriately (e.g. outputs a voltage Vss if it detects that the bit line voltage is dropping, or else maintains a high output voltage for that bit line).

It should be noted that for fast data sensing (within 1 ns), a differential amplifier (requiring 2 inputs instead of 1) may be preferable. In such cases a neighboring BIT line or "dummy" BIT line can be precharged to an appropriate level (e.g. Vdd/2) and used to provide the second input signal to the differential sense amplifier. In DRAM applications, a comparison to a reference cell (not shown) may also be used.

Note that to perform a read operation, the appropriate bit line(s) 630 can alternatively be precharged to a logic LOW level before the appropriate word line(s) 640 is pulsed to a logic HIGH level. If the data being stored is a logic LOW value, then capacitor 615 will not pull up the voltage on BIT line 630 (through access transistor 620). If the data being stored is a logic HIGH value, then capacitor 615 will pull up the voltage on BIT line 630 through access transistor 620. The sense amplifier 693 connected to bit line 630 will then output a logic HIGH output if it detects that the bit line voltage is rising, or else it will maintain a logic LOW output for that bit line.

While this invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicant further reserves the right to pursue new and/or additional claims directed to any such novel and non-obvious features during the prosecution of the present application (and/or any related applications).

The invention claimed is:

1. A method of operating a random access memory (RAM) cell, the method comprising:
coupling a pull-up element with a switchable current path between a storage node of the RAM cell and a high voltage source, wherein the pull-up element is a negative differential resistance (NDR) device;
maintaining the switchable current path of the pull-up element in an off condition during a first period when the RAM cell is storing a first voltage at the storage node; and
turning on the switchable current path of the pull-up element during at least portions of a second period when the RAM cell is storing a second voltage at the storage node, thereby refreshing the second voltage at the storage node, wherein the NDR device is a metal insulator semiconductor field effect transistor (MISFET) that includes a trapping layer for trapping electrons from the switchable current path.

2. The method of claim 1, wherein the high voltage source supplies an upper voltage VDD.

3. The method of claim 2 further comprising:
maintaining the second voltage, wherein maintaining the second voltage includes increasing a magnitude of the upper voltage VDD.

4. The method of claim 1, wherein the second voltage is a logic HIGH voltage obtained by charging a capacitor.

5. The method of claim 4 further comprising:
maintaining the second voltage, wherein due to leakage current, maintaining the second voltage includes turning on the pull-up element to recharge the capacitor, thereby refreshing the logic HIGH voltage at the storage node.

6. The method of claim 5, wherein an increased voltage deviation at the storage node due to the leakage current results in increased current through the pull-up element.

7. The method of claim 1, wherein the first voltage is a logic LOW voltage obtained by discharging a capacitor.

8. The method of claim 1, wherein turning on the switchable current path of the pull-up element includes providing a pulsed voltage signal to a gate of the pull-up element, the pulsed voltage signal being a standard threshold voltage of the pull-up element plus 0.5-1.0 volts.

9. The method of claim 1, wherein turning on the switchable current path of the pull-up element includes providing a pulsed voltage signal to a gate of the pull-up element, the pulsed voltage signal being an upper voltage VDD.

10. The method of claim 1, wherein the refreshing is independent of a refresh operation in any other RAM cell.

11. The method of claim 1, wherein a read/write operation performed during the refreshing is successful irrespective of the first voltage or the second voltage.

12. The method of claim 1, wherein the refreshing improves a speed of a write operation of the second voltage compared to a write operation without the refreshing.

13. A method of operating a random access memory (RAM) cell, the method comprising:
coupling a pull-up element with a switchable current path between a storage node of the RAM cell and a high voltage source, wherein the pull-up element is a negative differential resistance (NDR) transistor;
maintaining the switchable current path of the pull-up element in an off condition during a first period when the RAM cell is storing a first voltage at the storage node; and
turning on the switchable current path of the pull-up element during at least portions of a second period when the RAM cell is storing a second voltage at the storage node, thereby refreshing the second value at the storage node,
wherein maintaining the switchable current path of the pull-up element in the off condition during the first period and turning on the switchable current path of the pull-up element during at least portions of the second period comprises supplying a gate bias signal to a gate of the NDR transistor, the gate bias signal comprising periodic high voltage pulses, wherein the periodic high voltage pulses are greater than a threshold voltage of the NDR transistor.

14. The method of claim 13, wherein the high voltage source supplies an upper voltage VDD.

15. The method of claim 14 further comprising:
maintaining the second voltage, wherein maintaining the second voltage includes increasing a magnitude of the upper voltage VDD.

16. The method of claim 13, wherein the second voltage is a logic HIGH voltage obtained by charging a capacitor.

17. The method of claim 13 further comprising:
maintainin the second voltage, wherein due to leakage current, maintaining the second voltage includes turning on the pull-up element to recharge the capacitor, thereby refreshing the logic HIGH voltage at the storage node.

18. The method of claim 17, wherein an increased voltage deviation at the storage node due to the leakage current results in increased current through the pull-up element.

19. The method of claim 13, wherein the first voltage is a logic LOW voltage obtained by discharging a capacitor.

20. The method of claim 13, wherein each of the periodic high voltage pulses is a standard threshold voltage of the pull-up element plus 0.5-1.0 volts.

21. The method of claim 13, wherein each of the periodic high voltage pulses is an upper voltage VDD.

22. The method of claim 13, wherein the refreshing is independent of a refresh operation in any other RAM cell.

23. The method of claim 13, wherein a read/write operation performed during the refreshing is successful irrespective of the first voltage or the second voltage.

24. The method of claim 13, wherein the refreshing improves a speed of a write operation of the second voltage compared to a write operation without the refreshing.

25. A method of operating a random access memory (RAM) comprising a plurality of memory cells,
wherein each of the plurality of memory cells comprises a pull-up device and a storage capacitor connected in series between a high voltage source and a low voltage source, the pull-up device being a negative differential resistance (NDR) transistor, and
wherein a junction between the pull-up device and the storage capacitor form a data storage node,
the method comprising applying high bias voltage pulses to the gate of the pull-up device in each of the plurality of memory cells,
wherein when a first voltage is stored at the data storage node, each high bias voltage pulse causes the pull-up device to be placed in an ON state, and
wherein when a second voltage is stored at the data storage node, the high bias voltage pulses do not cause the pull-up device to be placed in an ON state.

26. The method of claim 25, wherein the high voltage source supplies an upper voltage VDD.

27. The method of claim 26 further comprising:
maintaining the first voltage, wherein maintaining the first voltage includes increasing a magnitude of the upper voltage VDD.

28. The method of claim 25, wherein the first voltage is a logic HIGH voltage obtained by charging the storage capacitor.

29. The method of claim 28 further comprising:
maintaining the first voltage, wherein due to leakage current, maintaining the first voltage includes recharging the storage capacitor, thereby refreshing the logic HIGH voltage at the storage node.

30. The method of claim 29, wherein an increased voltage deviation at the data storage node due to the leakage current results in increased current through the pull-up device.

31. The method of claim 25, wherein the second voltage is a logic LOW voltage obtained by discharging the storage capacitor.

32. The method of claim 25, wherein each high bias voltage pulse is a standard threshold voltage of the pull-up device plus 0.5-1.0 volts.

33. The method of claim 25, wherein each high bias voltage pulse is an upper voltage VDD.

34. The method of claim 25, wherein a refresh operation of the memory cell is independent of any other memory cell of the plurality of memory cells.

35. The method of claim 25, wherein a read/write operation performed during a refresh operation of the RAM is successful irrespective of the first voltage or the second voltage.

36. The method of claim 25, wherein a refresh of the RAM improves a speed of a write operation of the first voltage compared to a write operation without the refreshing of the RAM.

* * * * *

UNITED STATES PATENT AND TRADEMARK OFFICE
CERTIFICATE OF CORRECTION

PATENT NO. : 7,995,380 B2
APPLICATION NO. : 12/250463
DATED : August 9, 2011
INVENTOR(S) : Tsu-Jae King Liu It is certified that error appears in the above-identified patent and that said Letters Patent is hereby corrected as shown below:

References Cited (56)
Page 3, 1st Column, 5th line, amend

"King, Tsu-Jae et al., U.S. Appl. No. 09/602,668, entitled "CMOS Compatible Process for Making a Tunable Negative Differential (NDR) Device," filed Jun. 22, 2000, 33 pages."

to

--King, Tsu-Jae et al., U.S. Appl. No. 09/602,658, entitled "CMOS Compatible Process for Making a Tunable Negative Differential (NDR) Device," filed Jun. 22, 2000, 33 pages.--.

Column 23
Line 55, amend "value" to --voltage--.

Column 24
Line 7, amend "13" to --16--.
Line 8, amend "maintainin" to --maintaining--.
Line 40, amend "the" (first occurrence) to --a--.
Line 61, insert --data-- before "storage".

Column 25
Line 7, amend "the" to --a--.

Signed and Sealed this
Fourth Day of September, 2012

David J. Kappos
*Director of the United States Patent and Trademark Office*